(12) United States Patent
Kishimoto et al.

(10) Patent No.: US 12,079,039 B2
(45) Date of Patent: Sep. 3, 2024

(54) ELECTRONIC APPARATUS

(71) Applicant: Samsung Display Co., Ltd., Yongin-si (KR)

(72) Inventors: Hirotsugu Kishimoto, Hwaseong-si (KR); Dasom Gu, Asan-si (KR); Yonghyuck Lee, Cheonan-si (KR); Hongkwan Lee, Yongin-si (KR); Yongchan Jeon, Cheonan-si (KR); Chul Ho Jeong, Seoul (KR); Hyunjun Cho, Seoul (KR); Eungil Choi, Cheonan-si (KR); Sohra Han, Cheonan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/834,022

(22) Filed: Jun. 7, 2022

(65) Prior Publication Data

US 2023/0096996 A1 Mar. 30, 2023

(30) Foreign Application Priority Data

Sep. 27, 2021 (KR) .................. 10-2021-0126925

(51) Int. Cl.
*G06F 1/16* (2006.01)
*G06F 3/046* (2006.01)
*H10K 50/84* (2023.01)
*H10K 59/122* (2023.01)
*H10K 102/00* (2023.01)

(52) U.S. Cl.
CPC .......... *G06F 1/1652* (2013.01); *G06F 1/1641* (2013.01); *G06F 1/1643* (2013.01); *G06F 3/046* (2013.01); *H10K 50/84* (2023.02); *G06F 2203/04102* (2013.01); *H10K 59/122* (2023.02); *H10K 2102/311* (2023.02)

(58) Field of Classification Search
CPC .... G06F 1/1652; G06F 1/1641; G06F 1/1643; H01L 51/5237; H01L 27/3246
See application file for complete search history.

(56) References Cited

U.S. PATENT DOCUMENTS

| 9,639,121 | B2 | 5/2017 | Min et al. |
| 10,474,266 | B2 | 11/2019 | Chae et al. |
| 10,976,873 | B2 | 4/2021 | Shin et al. |
| 11,275,404 | B2 * | 3/2022 | Bae ........................ G06F 3/0446 |

(Continued)

FOREIGN PATENT DOCUMENTS

| KR | 1020180095174 A | 8/2018 |
| KR | 1020190049242 A | 5/2019 |

(Continued)

*Primary Examiner* — Doon Y Chow
(74) *Attorney, Agent, or Firm* — CANTOR COLBURN LLP

(57) ABSTRACT

An electronic apparatus includes a display panel including a folding area foldable with respect to a folding axis and a non-folding area which is adjacent to the folding area, a support plate facing the display panel, and a digitizer which faces the display panel with the support plate therebetween and detects a first external input. The digitizer includes a plate including a reinforcing fiber, a first conductive layer on a first surface of the plate, and a second conductive layer on a second surface of the plate which is opposite to the first surface of the plate.

20 Claims, 18 Drawing Sheets

(56) References Cited

U.S. PATENT DOCUMENTS

| | | | | |
|---|---|---|---|---|
| 2010/0007942 A1* | 1/2010 | Oikawa | ............... | G02F 1/16755 |
| | | | | 359/296 |
| 2018/0031886 A1* | 2/2018 | Lightfoot | .............. | G09G 3/3651 |
| 2018/0335679 A1* | 11/2018 | Hashimoto | ......... | G02F 1/13338 |
| 2019/0132947 A1 | 5/2019 | Koo et al. | | |
| 2022/0129094 A1* | 4/2022 | Tatsuno | ................ | G06F 1/1616 |

FOREIGN PATENT DOCUMENTS

| KR | 10-2051803 B1 | 1/2020 |
|---|---|---|
| KR | 1020200084495 A | 7/2020 |

\* cited by examiner

ELECTRONIC APPARATUS

This application claims priority to Korean Patent Application No. 10-2021-0126925, filed on Sep. 27, 2021, and all the benefits accruing therefrom under 35 U.S.C. § 119, the entire contents of which are hereby incorporated by reference.

BACKGROUND

(1) Field

The present disclosure herein relates to an electronic apparatus, and more particularly, to a foldable electronic apparatus.

(2) Description of the Related Art

A multimedia electronic apparatus such as televisions, mobile phones, tablet computers, navigation devices, and game consoles may include a display panel displaying an image and an input sensor detecting an external input. With technological development, various flexible electronic apparatuses including a flexible display panel that is deformable, foldable, or rollable into a curved shape have been developed. The flexible electronic apparatus that is variously modified in shape may be easily transported and improve a convenience of use thereof.

SUMMARY

A flexible electronic apparatus includes a support member to support a display panel without hindering a folding or bending operation. To improve reliability and convenience of use of the flexible electronic apparatus, a lightweight support member which maintains mechanical properties is being developed.

The present disclosure provides an electronic apparatus having improved strength and reduced weight. The present disclosure provides an electronic apparatus including a display panel and an input sensor such as a digitizer, which is simplified in laminated structure and improved in folding reliability.

An embodiment provides an electronic apparatus including a display panel including a folding area foldable with respect to a folding axis extending in an extension direction and first and second non-folding areas which are spaced apart from each other with the folding area therebetween, a support plate below the display panel, and a digitizer below the support plate to detect a first external input. The digitizer includes a first sensing part overlapping the first non-folding area, and a second sensing part overlapping the second non-folding area and spaced apart from the first sensing part. Each of the first sensing part and the second sensing part includes a plate including a reinforcing fiber, a first conductive layer a top surface of the plate, and a second conductive layer on a bottom surface of the plate.

In an embodiment, the plate may further include a matrix part including a polymer, and the reinforcing fiber in the matrix part.

In an embodiment, the plate may further include an inorganic material that is in the matrix part.

In an embodiment, the plate may further include a black pigment or a black dye, which is in the matrix part.

In an embodiment, the plate may have a thickness of about 30 micrometers or more to about 150 micrometers or less.

In an embodiment, the plate may have a flexural modulus of about 10 gigapascals or more to about 50 gigapascals or less.

In an embodiment, the plate may include first reinforcing fibers extending in a first direction, and second reinforcing fibers extending in a second direction crossing the first direction. The first reinforcing fibers and the second reinforcing fibers may cross each other on the plane.

In an embodiment, the first direction may be parallel to the extension direction of the folding axis.

In an embodiment, each of the second reinforcing fibers may be one of above or below the first reinforcing fibers.

In an embodiment, each of the second reinforcing fibers may be alternately above and below the first reinforcing fibers.

In an embodiment, the plates may include a plurality of sub-plates stacked in a thickness direction thereof, and each of the plurality of sub-plates may include the first reinforcing fibers and the second reinforcing fibers.

In an embodiment, in the folded state of the display panel, the plate of the first sensing part may include a first curvature part overlapping the folding area and having a first curvature with respect to a first curvature center defined above the top surface of the plate, and a second curvature part extending from the first curvature part and having a second curvature with respect to a second curvature center defined below the bottom surface of the plate.

In an embodiment, the first curvature may be greater than the second curvature.

In an embodiment, the support plate may define a plurality of openings overlapping the folding area.

In an embodiment, the plurality of openings may be arranged in a lattice shape on the plane.

In an embodiment, the electronic apparatus may further include an input sensor on the digitizer to detect a second external input different from the first external input.

In an embodiment, an electronic apparatus includes a display panel including a folding area foldable with respect to a folding axis extending in one direction, and first and second non-folding areas spaced apart from each other with the folding area therebetween, a first support plate below the display panel and defining a plurality of openings overlapping the folding area, and a second support plate below the first support plate. The second support plate includes a first plate overlapping the first non-folding area, and a second plate spaced apart from the first plate and overlapping the second non-folding area. Each of the first support plate and the second support plate includes a reinforcing fiber.

In an embodiment, the electronic apparatus may further include first conductive layers on one surface of the first plate and one surface of the second plate, respectively, and second conductive layers on the other surface of the first plate and the other surface of the second plate, respectively.

In an embodiment, each of the first plate and the second plate may include first reinforcing fibers extending in a first direction, and second reinforcing fibers extending in a second direction crossing the first direction.

In an embodiment, each of the first plate and the second plate may overlap the folding area and include a curvature part bent at a curvature in the folded state of the display panel.

BRIEF DESCRIPTION OF THE FIGURES

The accompanying drawings are included to provide a further understanding of the invention, and are incorporated in and constitute a part of this specification. The drawings illustrate embodiments of the invention and, together with the description, serve to explain principles of the invention. In the drawings.

DETAILED DESCRIPTION

Figure 1A:
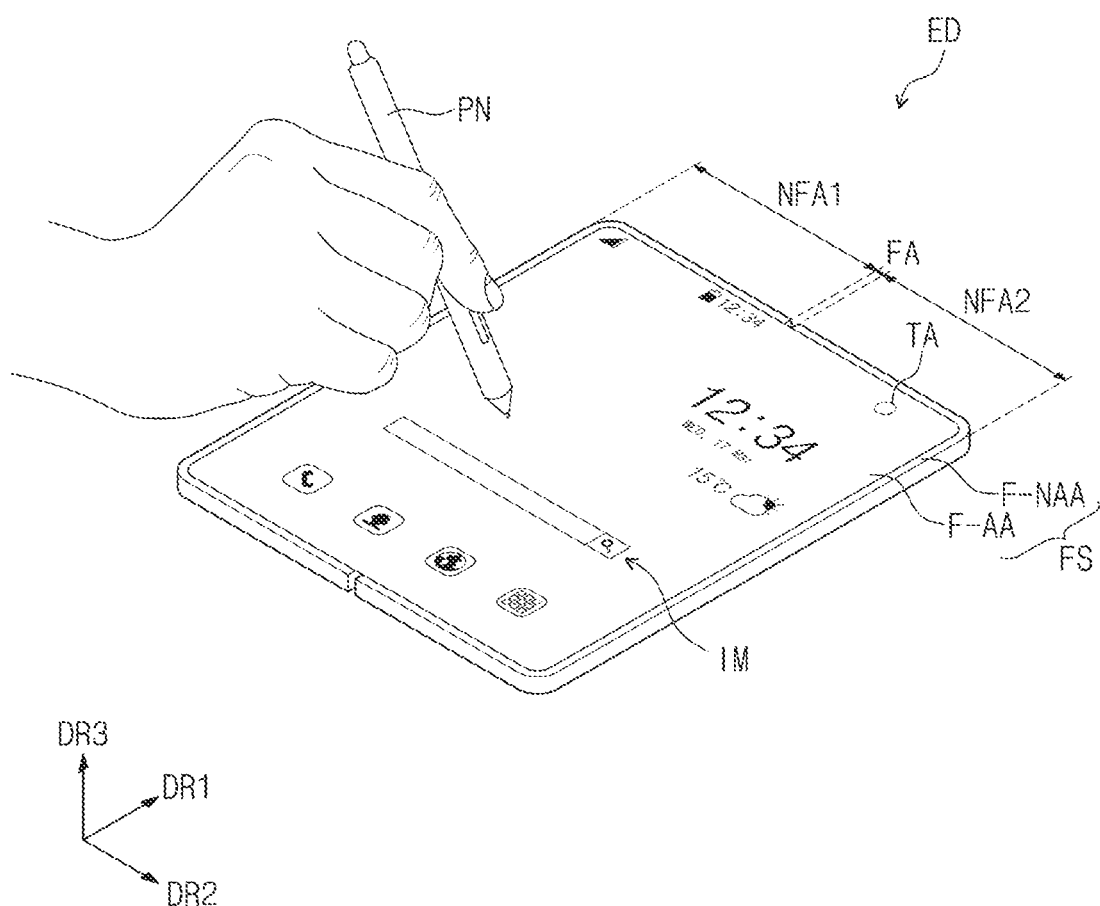
FIGS. 1A, 1B, 1C and 1D are perspective views of an electronic apparatus according to an embodiment.

Since the invention may have diverse modified embodiments, specific embodiments are illustrated in the drawings and are described in the detailed description of the invention. However, this does not limit the invention within embodiments and it should be understood that the invention covers all the modifications, equivalents, and replacements within the idea and technical scope of the invention.

In this specification, it will also be understood that when one component (or region, layer, portion) is referred to as being related to another element such as being 'on', 'connected to', or 'coupled to' another component, it can be directly disposed/connected/coupled on/to the one component, or an intervening third component may also be present. In contrast, when one component (or region, layer, portion) is referred to as being related to another element such as being 'directly on', 'directly connected to', or 'directly coupled to' another component, no intervening third component is present.

Like reference numerals refer to like elements throughout. Also, in the figures, the thickness, ratio, and dimensions of components are exaggerated for clarity of illustration.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. The terms of a singular form may include plural forms unless referred to the contrary. For example, "an element" has the same meaning as "at least one element," unless the context clearly indicates otherwise. "At least one" is not to be construed as limiting "a" or "an." "Or" means "and/or." The term "and/or" includes any and all combinations of one or more of the associated components.

As used herein, a reference number may indicate a singular element or a plurality of the element. For example, a reference number labeling a singular form of an element within the drawing figures may be used to reference a plurality of the singular element within the text of specification.

Also, "under", "below", "above", "upper", and the like are used for explaining relation association of the elements illustrated in the drawings. The terms may be a relative concept and described based on directions expressed in the drawings.

The meaning of 'include' or 'comprise' specifies a property, a fixed number, a step, an operation, an element, a component or a combination thereof, but does not exclude other properties, fixed numbers, steps, operations, elements, components or combinations thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by a person of ordinary skill in the art to which the invention belongs. In addition, terms such as terms defined in commonly used dictionaries should be interpreted as having a meaning consistent with the meaning in the context of the related technology, and unless explicitly defined here, they are interpreted as too ideal or too formal sense.

Hereinafter, an electronic apparatus ED according to an embodiment of the invention will be described with reference to the accompanying drawings.

Figure 1B:
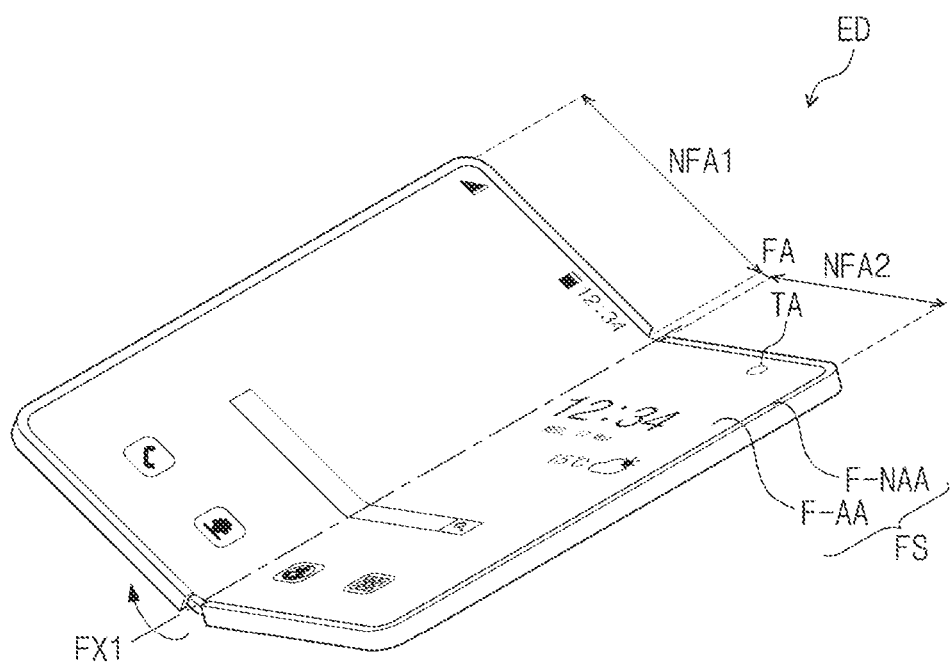
Figure 1B:
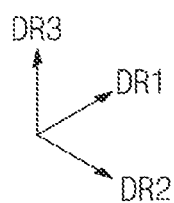
Figure 1C:
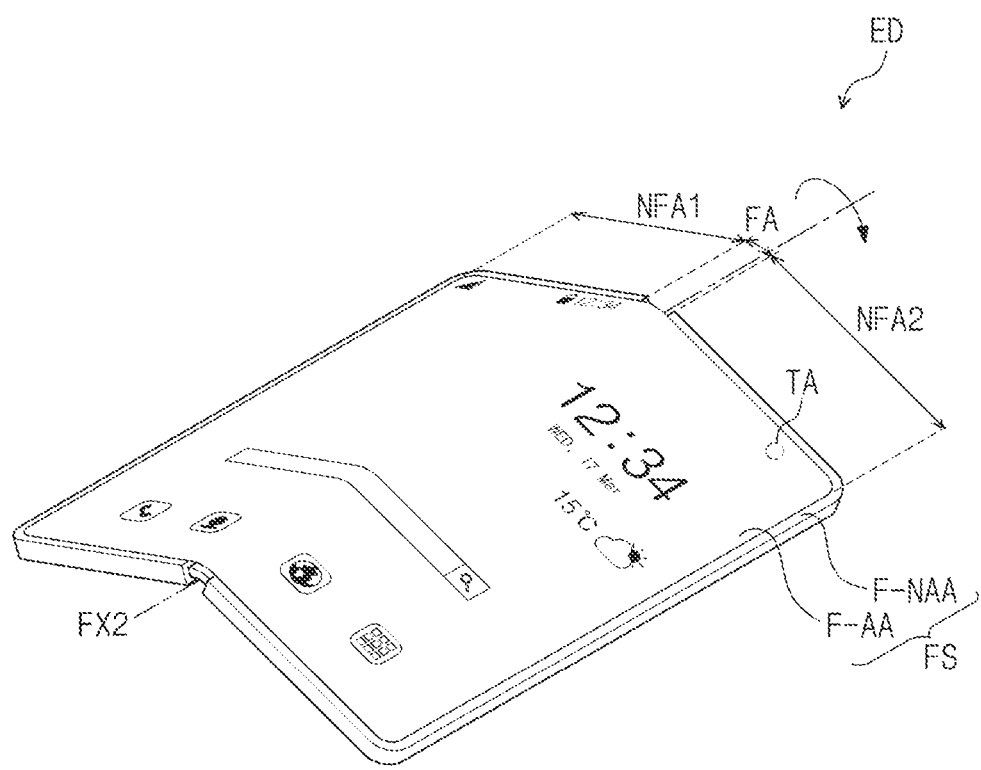
Figure 1D:
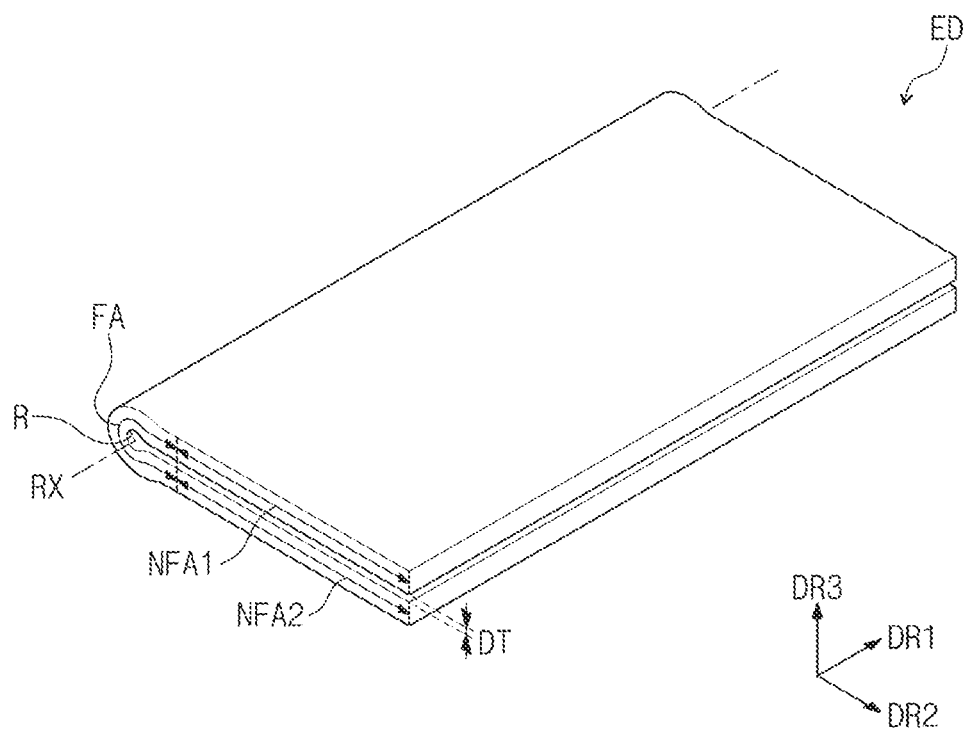

FIGS. 1A to 1D are perspective views of an electronic apparatus ED according to an embodiment. FIG. 1A illustrates an electronic apparatus ED that is unfolded (e.g., in an unfolded state), FIGS. 1B and 1C illustrate an example of a process of folding the electronic apparatus ED, and FIG. 1D illustrates the electronic apparatus ED that is completely folded (e.g., in a completely folded state).

The electronic apparatus ED may be an apparatus that is activated in response to an electrical signal to display an image IM. In an embodiment, for example, the electronic apparatus ED may include large-sized devices such as televisions, external billboards and the like, and small and medium-sized devices such as monitors, mobile phones, tablets, navigation devices, game consoles, and the like. The embodiments of the electronic apparatus ED are merely examples and are not limited thereto unless departing from the concept of the present disclosure. In this embodiment, a mobile phone is illustrated as an example of the electronic apparatus ED.

The electronic apparatus ED according to an embodiment may be flexible. The "flexible" means a bendable property and may include a structure that is completely folded to a few nanometer scales. In an embodiment, for example, the flexible electronic apparatus ED may include a curved apparatus or a foldable apparatus. In this embodiment, the foldable apparatus is illustrated as an example of the flexible electronic apparatus ED.

Referring to FIG. 1A, the electronic apparatus ED may have a rectangular shape having sides extending in a first direction DR1 and a second direction DR2 on a plane. However, the present disclosure is not limited thereto, and the electronic apparatus ED may have various shapes such as a circular shape and a polygonal shape on the plane.

The electronic apparatus ED that is in an unfolded state may display an image IM in a third direction DR3, on a display surface FS parallel to a plane defined by the first and second directions DR1 and DR2 crossing each other. The display surface FS on which the image IM is displayed may correspond to a front surface of the electronic apparatus ED. The image IM provided by the electronic apparatus ED may include a still image as well as a dynamic image. In FIG. 1A, the image IM is shown as a watch widget and icons as an example.

A front surface (or top surface) and a rear surface (or bottom surface) of each of members constituting the electronic apparatus ED may be opposed to each other in (or along) the third direction DR3, and a normal direction of each of the front and rear surfaces may be substantially parallel to the third direction DR3. A thickness direction may be defined along the third direction DR3. A distance between the front surface and the rear surface defined along the third direction DR3 may correspond to a thickness of the member (or unit). In this specification, the term "on the plane" may be defined as a state when viewed in (or along) the third direction DR3. In this specification, "on the cross-section" may be defined as a state when viewed from the first direction DR1 or the second direction DR2. The directions indicated as the first to third directions DR1, DR2, and DR3 may be a relative concept and thus changed into different directions.

The display surface FS of the electronic apparatus ED may include a display area F-AA and a peripheral area F-NAA. The display area F-AA may be an optically transparent area. Thus, the electronic apparatus ED may display the image IM through the display area F-AA, and the image IM may be visually recognized from outside the electronic apparatus ED. The peripheral area F-NAA may have a light transmittance less than that of the display area F-AA and may be provided as an area having a color.

The peripheral area F-NAA may be adjacent to the display area F-AA. A shape of the display area F-AA may be substantially defined by the peripheral area F-NAA. In an embodiment, for example, the peripheral area F-NAA may surround the display area F-AA. However, this is illustrated as example, and the peripheral area F-NAA may be disposed adjacent to only one side of the display area F-AA or may be omitted. Also, the peripheral area F-NAA may be disposed on a side surface of the electronic apparatus ED instead of the front surface thereof.

The display area F-AA may further include a signal transmission area TA. The signal transmission area TA may be provided as a portion (e.g., a planar area) of the display area F-AA, and some pixels PX among a plurality of pixels PX may be disposed in the signal transmission area TA. Thus, the electronic apparatus ED may display the image IM through the signal transmission area TA.

FIG. 1A illustrates an example, in which the signal transmission area TA is provided in the display area F-AA, but is not limited thereto. In an embodiment, for example, the signal transmission area TA may be provided inside the peripheral area F-NAA or may be surrounded by each of the display area F-AA and the peripheral area F-NAA. In addition, although FIG. 1A illustrates one signal transmission area TA as an example, this embodiment is not limited thereto. In an embodiment, for example, a plurality of the signal transmission areas TA may be provided.

An electronic module of the electronic apparatus ED may be disposed to correspond to the signal transmission area TA. The electronic module may provide a function to the electronic apparatus ED (e.g., functional module). In an embodiment, for example, the electronic module may be provided as a camera module CMM, a distance measuring sensor such as a proximity sensor, a biometric sensor that recognizes a portion of a body (e.g., fingerprint, iris, or face), a lamp that outputs light, and the like, but is not particularly limited. The electronic module may receive an external input transmitted through the signal transmission area TA or may provide an output through the signal transmission area TA. In an embodiment, for example, when the electronic module is provided as the camera module CMM, the camera module CMM may capture an external image through visible light passing through the signal transmission area TA, and when the electronic module is provided as the proximity sensor, the proximity sensor may determine accessibility of an external object through infrared rays passing through the signal transmission area TA.

The electronic apparatus ED may detect an external input applied from the outside (e.g., outside of the electronic apparatus ED). The external input may include various types of inputs provided from the outside of the electronic apparatus ED. In an embodiment, for example, the external input may include force, a pressure, a temperature, light, and the like. The external input may include not only an input that is in contact with the electronic apparatus ED (e.g., contact with an input tool such as a body part or a pen PN), but also an input applied in close proximity to or adjacent to the electronic apparatus ED by a predetermined distance (e.g., hovering).

In this embodiment, an example in which the external input is a touch input by the pen PN applied to the front surface of the electronic apparatus ED is illustrated. The electronic apparatus ED may further include an additional input sensor (e.g., a digitizer) driven by a method using electromagnetic induction resonance (EMR) or an additional input sensor driven by a method using a change in capacitance, but is not limited to any one embodiment. Also, the electronic apparatus ED may detect an external input applied to the front surface, but is not limited thereto. In an embodiment, for example, the electronic apparatus ED may detect an external input applied to the side surface or the rear surface thereof according to a structure of the electronic apparatus ED.

The electronic apparatus ED may include a folding area FA and a non-folding area. The non-folding area may be provided in plural including non-folding areas NFA1 and NFA2. FIG. 1A illustrates an example in which the electronic apparatus ED including a first non-folding area NFA1 and a second non-folding area NFA2. The folding area FA may be disposed between the first non-folding area NFA1 and the second non-folding area NFA2. That is, in an unfolded state, the first non-folding area NFA1, the folding area FA, and the second non-folding area NFA2 of the electronic apparatus ED may be arranged in order along the second direction DR2.

The folding area FA may be a flat area or a curved area having a curvature, according to a folding operation. As illustrated in FIG. 1A, when the electronic apparatus ED is in the unfolded state, the folding area FA may be flat. The first and second non-folding areas NFA1 and NFA2 may be flat areas maintained in both the folded and unfolded state.

The electronic apparatus ED may be folded around an imaginary folding axis (hereinafter, referred to as a folding axis) extending in one direction as an extension direction. In an embodiment, for example, as illustrated in FIGS. 1B to 1D, the electronic apparatus ED may be folded along the folding axes FX1 and FX2 extending in the first direction DR1. The folding axis may extend in a direction parallel to long sides of the electronic apparatus ED. However, this embodiment is not limited thereto. In an embodiment, for example, the folding axis may extend in a direction parallel to short sides of the electronic apparatus ED according to the structure of the electronic apparatus ED.

The electronic apparatus ED may be folded at an angle with respect to the folding axis. FIG. 1B illustrates an example in which the electronic apparatus ED is in an in-folded state at an angle, and FIG. 1C illustrates an example in which the electronic apparatus ED is in an out-folded state at an angle.

Referring to FIG. 1B, the first folding axis FX1 may be defined at the front surface of the electronic apparatus ED. Portions of the display surfaces FS corresponding to the first and second non-folding areas NFA1 and NFA2 of the electronic apparatus ED folded with respect to the first folding axis FX1, may face each other. Here, this state may be defined as the in-folded state. In the in-folded state, the display surface FS corresponding to the folding area FA of the electronic apparatus ED may face the first folding axis FX1 and be folded to form a concavely curved surface.

Referring to FIG. 1C, the second folding axis FX2 may be defined at the rear surface of the electronic apparatus ED. Portions of the display surfaces FS corresponding to the first and second non-folding areas NFA1 and NFA2 of the electronic apparatus ED folded with respect to the second folding axis FX2, may face away or opposite each other and may be exposed to the outside. Here, this state may be defined as the out-folded state. In the out-folded state, the display surface FS corresponding to the folding area FA of the electronic apparatus ED may opposite the second folding axis FX2 and may be folded to form a convexly curved surface. The display area F-AA of the out-folded electronic apparatus ED may be exposed to the outside, and the image may be visually recognized from outside even in the folded state.

Referring to FIG. 1D, the first and second non-folding areas NFA1 and NFA2 of the fully in-folded electronic apparatus ED may face each other while overlapping each other on the plane. Thus, the display surface FS (see FIG. 1A) corresponding to the front surface of the electronic apparatus ED may not be exposed to the outside.

Referring to FIG. 1D, at least a portion of the folding area FA of the in-folded electronic apparatus ED may have a curvature. In the in-folded state, the folding area FA may be folded with a curvature radius R with respect to a curvature center RX facing the folding area FA. According to an embodiment, the curvature radius R may be greater than a separation distance DT between the first non-folding area NFA1 and the second non-folding area NFA2, along the thickness direction. Thus, in an embodiment, the folding area FA may be folded to have a dumbbell shape when viewed from the first direction DR1.

The electronic apparatus ED according to an embodiment may operate in only one method selected from among the in-folding and the out-folding with respect to one folding axis, or may operate so that the in-folding and the out-folding are repeatable, but is not limited to any one example. In addition, in this embodiment, the electronic apparatus ED is folded around one folding axis, but the number of folding axes defined in the electronic apparatus ED is not limited thereto. In an embodiment, for example, the electronic apparatus ED may be respectively foldable about the plurality of folding axes.

Figure 2:
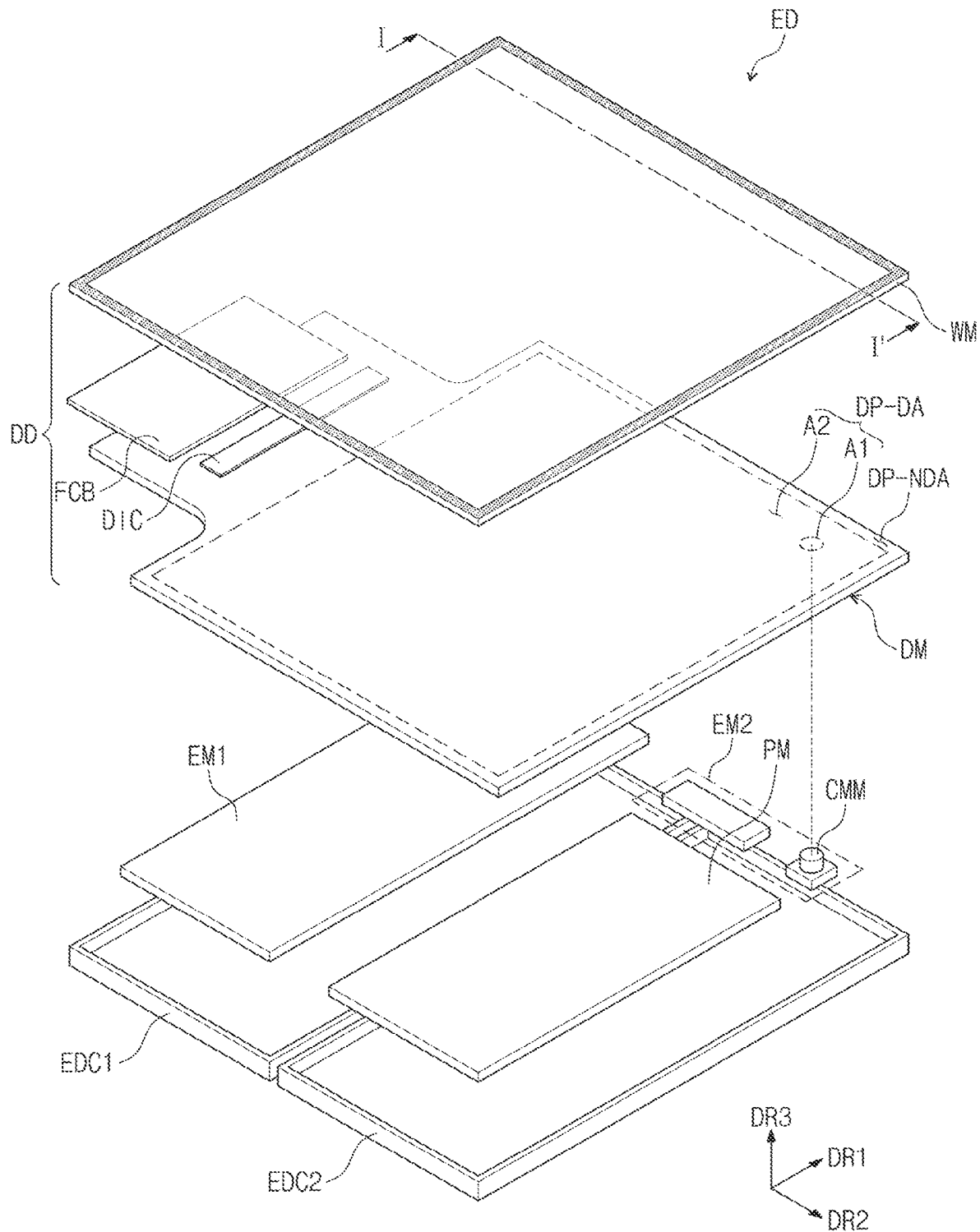
FIG. 2 is an exploded perspective view of the electronic apparatus according to an embodiment.
Figure 3:
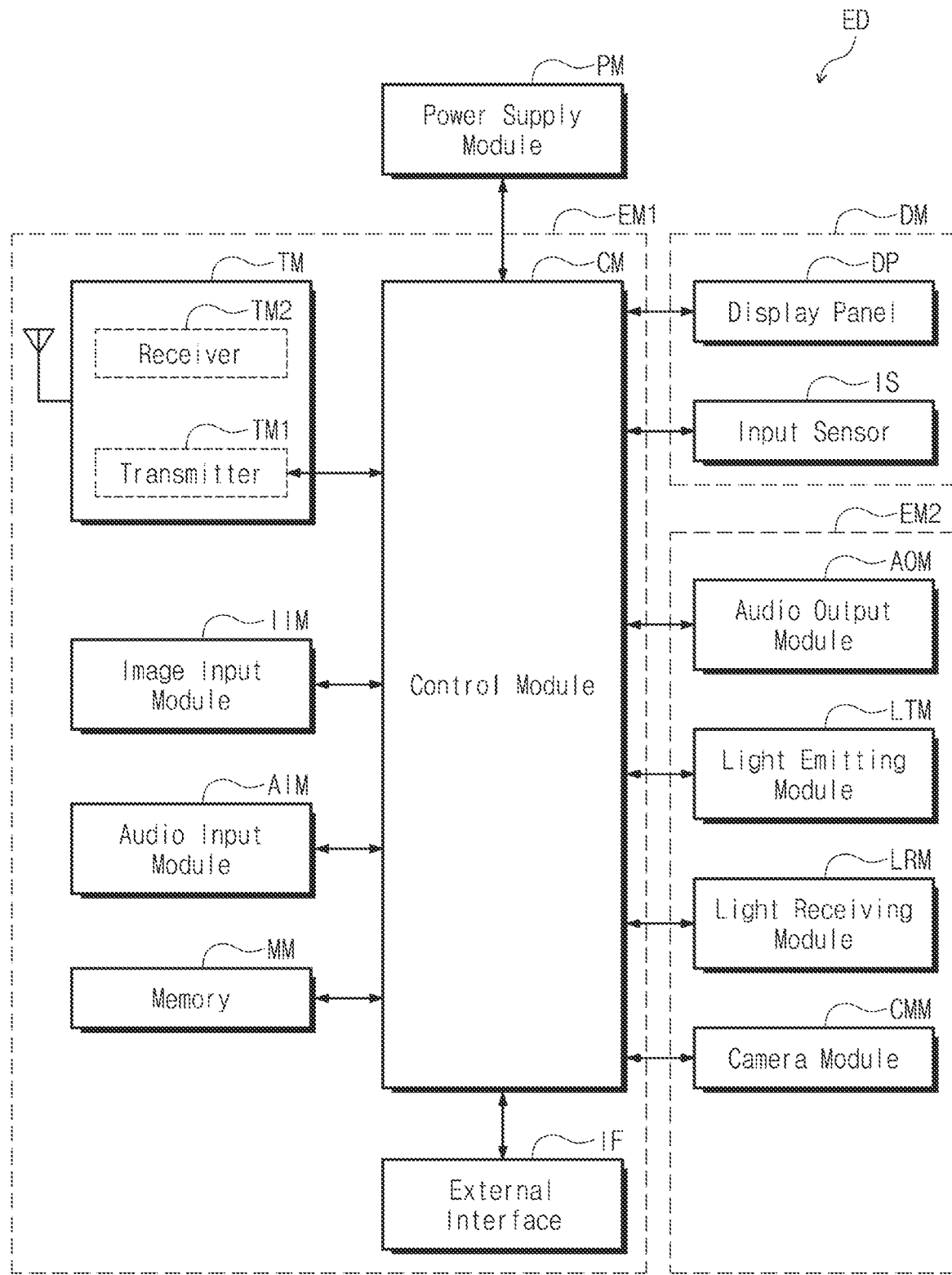
FIG. 3 is a block diagram of the electronic apparatus according to an embodiment.

FIG. 2 is an exploded perspective view of the electronic apparatus ED according to an embodiment. FIG. 3 is a block diagram of the electronic apparatus ED according to an embodiment.

Referring to FIG. 2, the electronic apparatus ED may include a display device DD, a first electronic module EM1, a second electronic module EM2, a power supply module PM, and cases EDC1 and EDC2. Although not shown separately, the electronic apparatus ED may further include a mechanical structure (e.g., a hinge) controlling the folding operation of the display device DD.

The display device DD according to an embodiment may generate an image IM and sense an external input. The display device DD may include a window module WM and a display module DM.

The window module WM may provide the front surface of the electronic apparatus ED. That is, the front surface of the window module WM may correspond to the front surface of the electronic apparatus ED. The window module WM may transmit light generated by the display module DM to provide the light to outside the display device DD. The window module WM may be disposed on the display module DM and may have a shape (e.g., planar shape) corresponding to the shape of the display module DM. The window module WM may cover the front surface of the display module DM to protect the display module DM from an external impact and damage such as a scratch.

Referring to FIGS. 2 and 3, the display module DM may include the display panel DP, and the display module DM may further include a plurality of components disposed above and below the display panel DP. According to an embodiment, the display module DM may further include an input sensor IS. A detailed laminated structure of the display module DM will be described in detail below.

The display panel DP may display an image IM in response to an electrical signal. The display panel DP according to an embodiment may be an emission type display panel, but is not limited thereto. In an embodiment, for example, the display panel DP may be an organic light emitting display panel, an inorganic light emitting display panel, or a quantum dot light emitting display panel. An emission layer of the organic light emitting display panel may include an organic light emitting material, and an emission layer of the inorganic light emitting display panel may include an inorganic light emitting material. An emission layer of the quantum dot light emitting display panel may include a quantum dot, a quantum rod, and the like. Hereinafter, the display panel DP is described as an organic light emitting display panel.

The input sensor IS may detect an external input applied from the outside of the electronic apparatus ED and obtain coordinate information of the external input. The input sensor IS may be driven in various methods such as a capacitive method, a resistive method, an infrared method, or a pressure method, but is not limited thereto.

Referring to FIG. 2, the display module DM may include a display area DP-DA on which an image IM provided by the display panel DP is displayed, and a non-display area DP-NDA on which an image is not displayed. The display area DP-DA of the display module DM may correspond to the display area F-AA of the electronic apparatus ED, and the non-display area DP-NDA of the display module DM may correspond to the peripheral area F-NAA of the electronic apparatus ED. In this specification, that "area/portion and area/portion corresponds to each other" means "overlapping with each other", but is not limited to having the same area and/or the same shape.

The display area DP-DA of the display module DM may include a first area A1 and a second area A2. In an embodiment, the second area A2 may surround the first area A1. However, this embodiment is not limited thereto, and the second area A2 may surround only a portion of the first area A1. In this embodiment, the first area A1 is illustrated as an area having a circular shape, but is not limited thereto. In an embodiment, for example, the first area A1 may be defined in various shapes such as an elliptical shape, a polygonal shape, and an irregular shape on the plane. The first area A1 may be referred to as a component area, and the second area A2 may be referred to as a main display area.

The first area A1 may overlap the signal transmission area TA (see FIG. 1A) of the electronic apparatus ED. The first area A1 may be an area overlapping (or corresponding to) a camera module CMM disposed under the display module DM. The first area A1 may have a light transmittance greater than that of the second area A2. Also, resolution of the first area A1 may be less than that of the second area A2. Light passing through the first area A1 may be transmitted to the camera module CMM, or a signal output from the camera module CMM may pass through the first area A1.

The display module DM may include a data driver DIC disposed on the non-display area DP-NDA. The data driver DIC may include a data driving circuit for driving elements. The data driver DIC may be manufactured in the form of an integrated circuit chip and mounted on the non-display area DP-NDA of the display module DM. The display module DM may further include a circuit board FCB connected to the non-display area DP-NDA. In an embodiment, the data driver DIC may be mounted on the circuit board FCB.

Referring to FIGS. 2 and 3, the power supply module PM, the first electronic module EM1, and the second electronic module EM2 may be disposed under the display module DM. The power supply module PM and the first and second electronic modules EM1 and EM2 may be connected to each other through a separate flexible circuit board. The power supply module PM may supply power used for an overall operation of the electronic apparatus ED. The power supply module PM may include a general battery module.

The first electronic module EM1 and the second electronic module EM2 may include various functional modules driving the electronic apparatus ED. Each of the first electronic module EM1 and the second electronic module EM2 may be directly mounted on a mother board electrically connected to the display panel DP or may be mounted on a separate board and electrically connected to the mother board through a connector.

The first electronic module EM1 may include a control module CM, a wireless communication module TM, an image input module IIM, an audio input module AIM, a memory MM, and an external interface IF.

The control module CM may control an overall operation of the electronic apparatus ED. The control module CM may include at least one microprocessor. In an embodiment, for example, the control module CM may activate or deactivate the display module DM according to an input, such as a user input. In addition, the control module CM may control other modules such as the image input module IIM and the audio input module AIM according to the input.

The wireless communication module TM may communicate with an external electronic apparatus through a first network (e.g., a short-range communication network such as Bluetooth, WiFi direct or IrDA (infrared data association)) or a second network (e.g., a cellular network, Internet, or a computer network (e.g., LAN or WAN)). The communication modules provided in the wireless communication module TM may be integrated into one component (e.g., a single chip) or implemented as a plurality of components (e.g., multiple chips), which are separated from each other. The wireless communication module TM may transmit/receive an audio signal by using a general communication line. The wireless communication module TM may include a transmitter TM1 modulating and transmitting a signal to be transmitted, and a receiver TM2 demodulating the received signal.

The image input module TIM may process the image signal to convert the processed image signal into image data that is capable of being displayed on the display panel DP. The audio input module AIM may receive external audio signals such as by using a microphone during recording mode, voice recognition mode to convert the received audio signal into electrical sound data.

The external interface IF may include a connector capable of physically connecting the electronic apparatus ED to the external electronic apparatus. The external interface IF may serve as an interface connected to an external charger, a wired/wireless data port, and a card socket (for example, a memory card and an SIM/UIM card).

The second electronic module EM2 may include an audio output module AOM, a light emitting module LTM, a light receiving module LRM, and a camera module CMM.

The audio output module AOM may convert audio data received from the wireless communication module TM or audio data stored in the memory MM, to output the converted audio data to the outside.

The light emitting module LTM may generate and output light. In an embodiment, the light emitting module LTM may output infrared rays. The light emitting module LTM may include a light emitting diode (LED). The light receiving module LRM may sense the infrared rays. The light receiving module LRM may be activated when infrared rays having a predetermined level or more is sensed. In an embodiment, the light receiving module LRM may include a CMOS sensor. The infrared rays generated in the light emitting module LTM may be outputted and then be reflected by an external object (for example, a body part such as a finger or face), and the reflected infrared rays may be incident into the light receiving module LRM.

The camera module CMM may capture a still image and a moving image. In an embodiment, the camera module CMM may be provided in plurality. The camera module CMM may overlap the first area A1 of the display module DM and may receive an optical signal through the first area A1. In an embodiment, for example, the camera module CMM may receive an external image by receiving natural light passing through the first area A1 from the outside.

The window module WM and the cases EDC1 and EDC2 may be coupled to each other to define an outer appearance of the electronic apparatus ED, and may provide an internal space that accommodates the components of the electronic apparatus ED. In an embodiment, for example, the cases EDC1 and EDC2 may accommodate the display module DM, the first and second electronic modules EM1 and EM2, and the power supply module PM and protect the accommodated components of electronic apparatus ED. The electronic apparatus ED may further include a hinge structure connecting the cases EDC1 and EDC2 to each other or to other.

Figure 4:
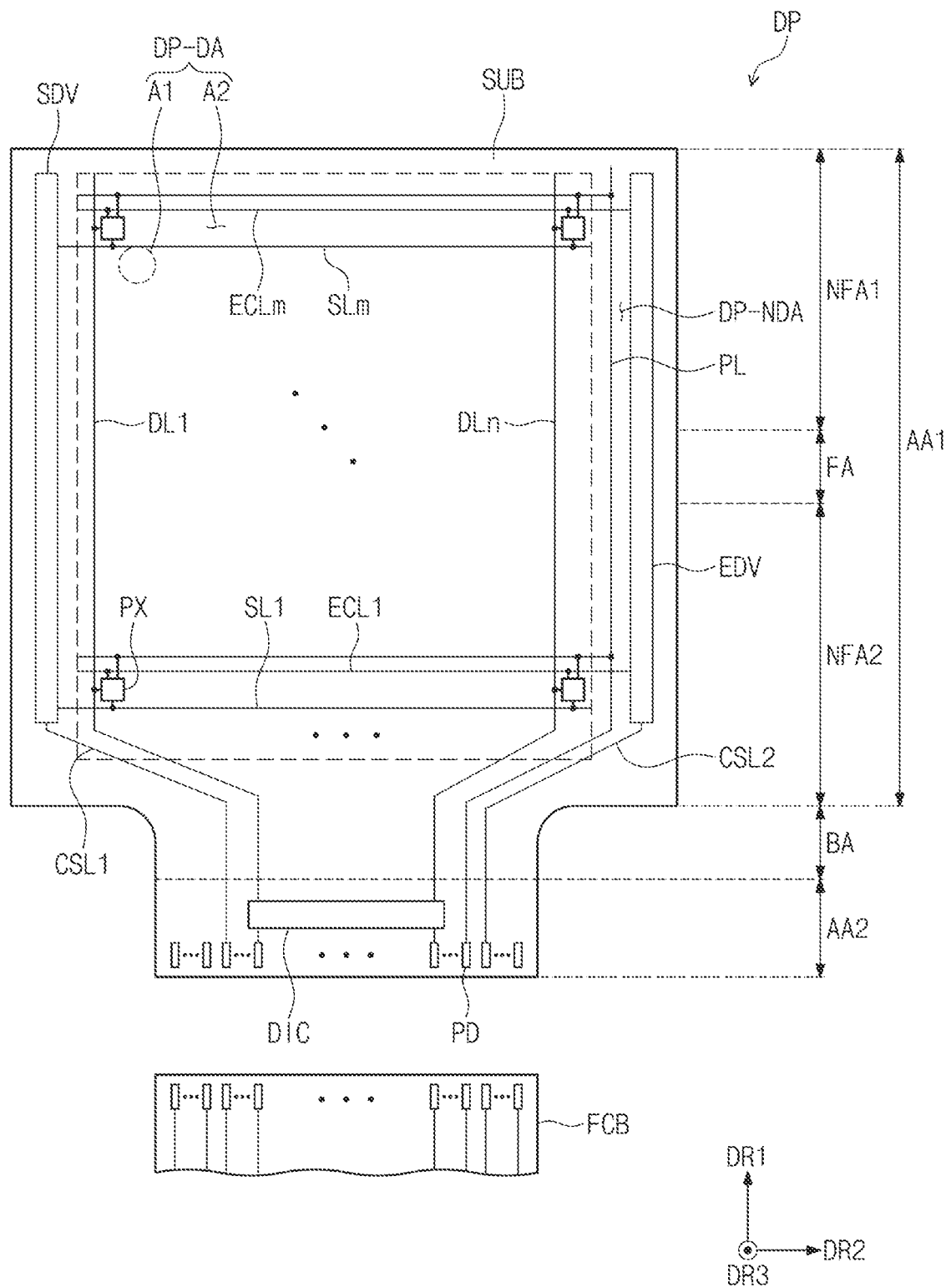
FIG. 4 is a plan view of a display panel according to an embodiment.

FIG. 4 is a plan view of the display panel DP according to an embodiment. Referring to FIG. 4, the display panel DP may include a base substrate SUB, a plurality of pixels PX, a plurality of signal lines electrically connected to the pixels PX, and a scan driver SDV, a data driver DIC, a light emission driver EDV, and a plurality of pads PD.

The plurality of signal lines include a plurality of scan lines SL1 to SLm, a plurality of data lines DL1 to DLn, a plurality of emission lines ECL1 to ECLm, first and second control lines CSL1 and CSL2, and a power line PL. Here, 'm' and 'n' are natural numbers.

The base substrate SUB may include the display area DP-DA and the non-display area DP-NDA, which correspond to those features described above. The base substrate SUB may provide a base surface on which electrical elements and lines (e.g., signal, conductive, etc.) of the display panel DP are disposed. The display area DP-DA may be an area on which an image IM is displayed by the pixels PX, and the non-display area DP-NDA may be an area on which drivers disposed adjacent to the display area DP-DA to drive the pixels PX are disposed.

The base substrate SUB may be a flexible substrate. The base substrate SUB may include a first panel area AA1, a second panel area AA2, and a bending area BA. The bending area BA may be disposed between the first panel area AA1 and the second panel area AA2, and the first panel area AA1, the bending area BA and the second panel area AA2 may be arranged in order along the first direction DR1. However, a shape of the base substrate SUB on the plane is not limited to the illustrated shape and may be variously modified according to the structure of the electronic apparatus ED.

The first panel area AA1 may include the display area DP-DA. Remaining portions of the first panel area AA1, the bending area BA, and the second panel area AA2, except for the display area DP-DA, may correspond to the non-display area DP-NDA.

The first panel area AA1 may include a first non-folding area NFA1, a second non-folding area NFA2, and a folding area FA. Thus, according to the folding of the electronic apparatus ED, the first panel area AA1 of the display panel DP may be folded about one or more of the folding axes FX1 and FX2.

The bending area BA may be an area at which the display panel DP is bendable to define a curvature of the display panel DP which is accommodated in the cases EDC1 and EDC2 (see FIG. 2). The display panel DP which is bent at bending area BA may dispose the second panel area AA2 overlapping the first panel area AA1 on the plane. The bending area BA may be bent about an imaginary bending axis parallel to the second direction DR2. A width of the bending area BA parallel to the second direction DR2 may be less than a width of the first panel area AA1, and thus, the bending area BA may be easily bent.

Each of the pixels PX may include a pixel driving circuit including a light emitting element OLE, a plurality of transistors (e.g., a switching transistor, a driving transistor, etc.) which are connected to the light emitting element OLE, and a capacitor. Each of the pixels PX may emit light in response to an electrical signal applied to the pixel PX. The pixels PX may be disposed on the display area DP-DA. However, this is merely an example, and some of the pixels PX may include a thin film transistor disposed on the non-display area DP-NDA, but is not limited to any one embodiment.

The display area DP-DA may include a first area A1 and a second area A2, which are described above. The pixels PX may be disposed on the first area A1 and the second area A2. The pixels PX disposed on (or in) the first area A1 may be different in arrangement, density, size, area, and the like from those of the pixels PX disposed on (or in) the second area A2. Thus, the first area A1 may be provided as an area having a relatively large light transmittance compared to the second area A2, and the first area A1 may display an image IM and also allow the electronic module (e.g., the camera module CMM of FIG. 2) disposed to overlap the first area A1 to easily transmit/receive an optical signal.

Each of the scan driver SDV, the data driver DIC, and the light emission driver EDV may be disposed on the non-display area DP-NDA. In an embodiment, the scan driver SDV and the light emission driver EDV may be disposed on the first panel area AA1, and the data driver DIC may be disposed on the second panel area AA2. However, this embodiment is not limited thereto. In an embodiment, at least one of the scan driver SDV, the data driver DIC, and the light emission driver EDV may overlap the display area DP-DA, and thus, the display panel DP in which the non-display area DP-NDA is reduced in overall planar area may be realized.

The pixels PX may be connected to a corresponding scan line, data line, and light emission line among the scan lines SL1 to SLm, the data lines DL1 to DLn, and the emission lines ECL1 to ECLm, respectively. More types of signal lines may be provided in the display panel DP according to the configuration of the pixel driving circuit of the pixels PX.

The scan lines SL1 to SLm may extend in the second direction DR2 and be connected to the scan driver SDV. The data lines DL1 to DLn may extend in the first direction DR1 and be connected to the data driver DIC. The emission lines ECL1 to ECLm may extend in the second direction DR2 and be connected to the light emission driver EDV.

The power line PL may include a portion extending in the first direction DR1 and a portion extending in the second direction DR2. A portion of the power line PL, which extends in the first direction DR1, and a portion of the power line PL, which extends in the second direction DR2, may be disposed on different layers from each other. However, this embodiment is not limited thereto. In an embodiment, for example, a portion of the power line PL, which extends in the first direction DR1, and a portion of the power line PL, which extends in the second direction DR2, may be integrally provided on the same layer. The portion of the power line PL, which extends in the first direction DR1, may extend to the second panel area AA2, via the bending area BA. The power line PL may receive a driving voltage to provide the driving voltage to the pixels PX. As being on a same layer, elements may be formed in a same process and/or as including a same material, elements may be in a same layer as each other as respective portions of a same material layer, may be on a same layer by forming an interface with a same underlying or overlying layer, etc., without being limited thereto.

The first control line CSL1 may be connected to the scan driver SDV and extend toward the lower end of the second panel area AA2 via the bending area BA. The second control line CSL2 may be connected to the light emission driver EDV and extend toward the lower end of the second panel area AA2 via the bending area BA.

A pad PD may be provided in plural including a plurality of pads PD disposed adjacent to the lower end of the second panel area AA2. The pads PD may be disposed closer to the lower end of the display panel DP than the data driver DIC. The pads PD may be arranged along the second direction DR2. The pads PD may be portions of the display panel DP at which the display panel DP is connected to the circuit board FCB.

The circuit board FCB may include a an external circuit board including a timing controller controlling the operations of the scan driver SDV, the data driver DIC and the light emission driver EDV, and a voltage generator generating a voltage, and may be electrically connected to the display panel DP through the pads PD.

Each of the pads PD may be connected to the corresponding signal line among the plurality of signal lines. The power line PL and the first and second control lines CSL1 and CSL2 may be connected to the pads PD. The data lines DL1 to DLn may be connected to corresponding pads PD through the data driver DIC. In an embodiment, for example, the data lines DL1 to DLn may be connected to the data driver DIC, and the data driver DIC may be connected to the pads PD, which respectively correspond to the data lines DL1 to DLn.

The scan driver SDV may generate scan signals in response to scan control signals. The scan signals may be applied to the pixels PX through the scan lines SL1 to SLm. The data driver DIC may generate data voltages corresponding to image signals in response to data control signals. The data voltages may be provided to the pixels PX through the data lines DL1 to DLn. The light emission driver EDV may generate emission signals in response to emission signals. The emission signals may be applied to the pixels PX through the emission lines ECL1 to ECLm.

The pixels PX may receive the data voltages in response to the scan signals. The pixels PX may emit light having luminance corresponding the data voltages in response to the emission signals to display an image IM. Emission times of the pixels PX may be controlled by the emission signals, respectively. Thus, the display panel DP may output an image IM at the display area DP-DA by driving or control of the pixels PX.

Figure 5:
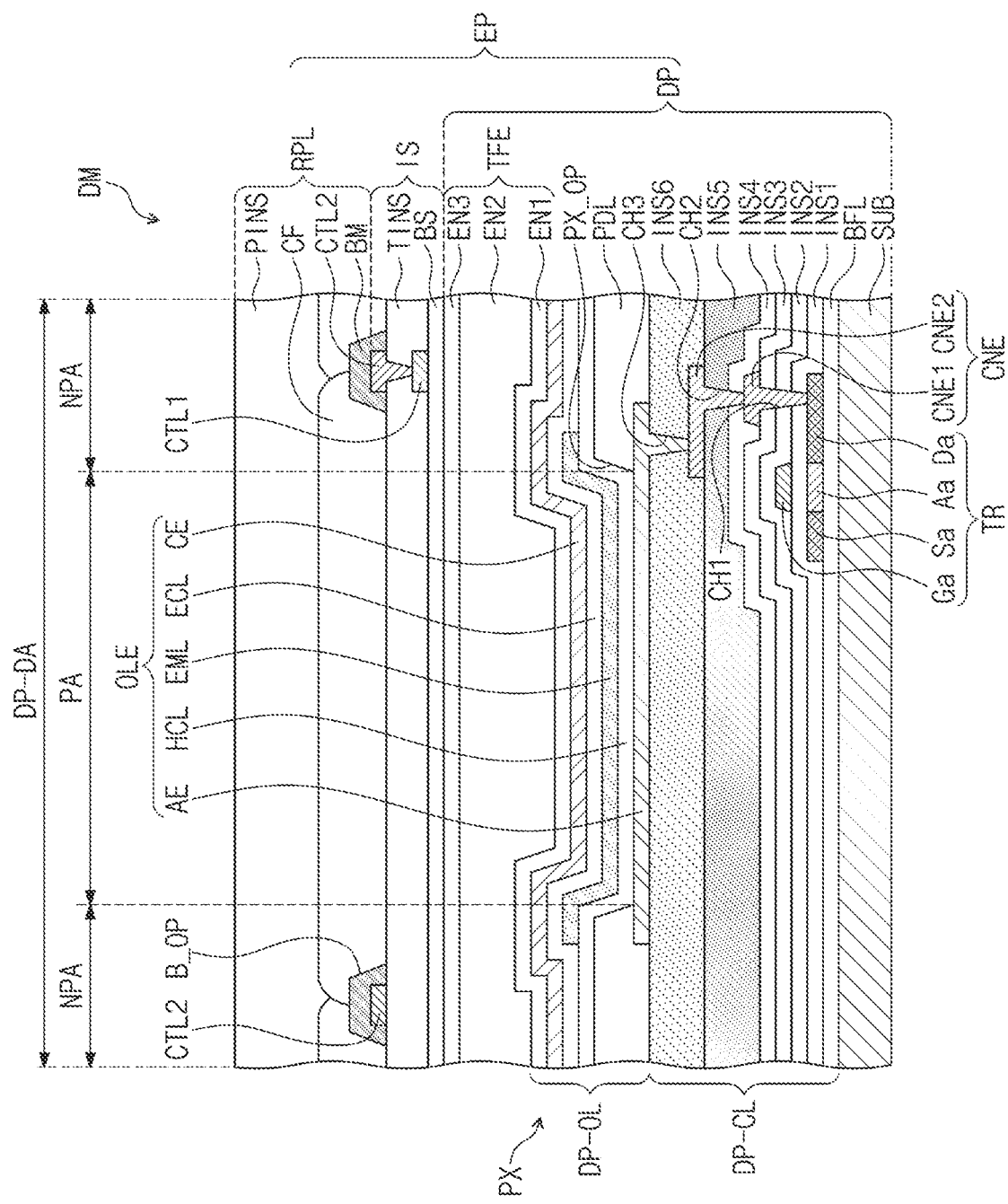
FIG. 5 is a cross-sectional view of a display module according to an embodiment.

FIG. 5 is a cross-sectional view of the display module DM according to an embodiment. Referring to FIG. 5, the display module DM may include a display panel DP, an input sensor IS, and an anti-reflection layer RPL, and the display panel DP, the input sensor IS, and the anti-reflection layer RPL, which are sequentially laminated, may be defined as an electronic panel EP. FIG. 5 illustrates a cross-section of the electronic panel EP corresponding to one pixel PX.

Referring to FIG. 5, the display panel DP may include the pixel PX, and the pixel PX may include a transistor TR and a light emitting element OLE, which are disposed on the base substrate SUB. Substantially, the pixel PX may include a plurality of transistors and at least one capacitor, which drive the light emitting element OLE, but FIG. 5 illustrates an example of a cross-section of one transistor TR.

The display area DP-DA may include an emission area PA corresponding to the pixel PX, and a non-emission area NPA adjacent to the emission area PA. The display panel DP may include the plurality of pixels PX as described above, and thus, the display area DP-DA may include a plurality of emission areas PA corresponding to the plurality of pixels PX. Here, the non-emission area NPA may surround the plurality of emission areas PA.

The display panel DP may include a base substrate SUB, a circuit layer DP-CL, a display element layer DP-OL, and an encapsulation layer TFE.

The base substrate SUB may include a glass substrate, a metal substrate, a polymer substrate, or an organic/inorganic composite substrate. In an embodiment, the base substrate SUB may include a synthetic resin layer having flexibility. In an embodiment, for example, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, a perylene-based resin, and a polyimide-based resin. However, a material of the base substrate SUB is not limited to the above example.

The circuit layer DP-CL may be disposed on the base substrate SUB. The circuit layer DP-CL may include at least one insulating layer, a conductive pattern, and a semiconductor pattern. In a process of manufacturing (or providing) the display panel DP, an insulating layer, a semiconductor layer, and a conductive layer may be disposed on the base substrate SUB by coating, deposition, or the like, and then, the insulating layer, the semiconductor layer, and the conductive layer may be selectively patterned in a photolithography manner. The semiconductor pattern, the conductive pattern, the signal line, and the like provided in the circuit layer DP-CL may be formed through these processes.

FIG. 5 illustrates a buffer layer BFL, first to sixth insulating layers INS1 to INS6, and the semiconductor pattern and the conductive pattern, which are disposed between the buffer layer BFL and the first to sixth insulating layers INS1 to INS6, which are provided in the circuit layer DP-CL. However, a cross-section of the circuit layer DP-CL illustrated in FIG. 5 is merely an example, and a stacked structure of the circuit layer DP-CL may be variously modified according to configurations of elements provided in a process, a process method, or the configuration of elements provided in the pixel PX.

The buffer layer BFL may be disposed on the base substrate SUB. The buffer layer BFL may prevent foreign substances from being introduced into the semiconductor pattern of the transistor TR, from the outside thereof. In addition, the buffer layer BFL may improve the bonding force between the base substrate SUB and the semiconductor pattern or the conductive pattern. The buffer layer BFL may include an inorganic layer, for example, the buffer layer BFL may include at least one of a silicon oxide layer and a silicon nitride layer. In an embodiment, the buffer layer BFL may include silicon oxide layers and silicon nitride layers, which are alternately stacked with each other.

The semiconductor pattern of the transistor TR may be disposed on the buffer layer BFL. A source Sa (e.g., source area), a channel Aa (or an active area), and a drain Da (e.g., drain area) of the transistor TR may be formed from or defined by a semiconductor pattern. The semiconductor pattern of the transistor TR may include a silicon semiconductor, and the silicon semiconductor may include a single crystal silicon semiconductor, a polysilicon semiconductor, or an amorphous silicon semiconductor. However, the semiconductor pattern of the transistor TR is not limited thereto, and the semiconductor pattern of the transistor TR may include an oxide semiconductor such as a transparent conductive material such as indium tin oxide (ITO), indium zinc oxide (IZO), indium gallium zinc oxide (IGZO), zinc oxide (ZnO), or indium oxide ($In_2O_3$). The semiconductor pattern of the transistor TR according to an embodiment may be made of various materials as long as the semiconductor pattern has semiconductor properties, but is not limited to any one embodiment.

The semiconductor pattern of the transistor TR may be divided into a plurality of regions according to conductivity. In an embodiment, for example, electrical properties of the semiconductor pattern may vary according to whether the semiconductor pattern is doped, or metal oxide is reduced. A region having high conductivity in the semiconductor pattern may serve as an electrode or a signal line and may correspond to the source Sa and the drain Da of the transistor TR. A non-doped or non-reduced region with relatively low conductivity may correspond to a channel Aa of the transistor TR.

The first to sixth insulating layers INS1 to INS6 may be disposed on the semiconductor pattern. The first to sixth insulating layers INS1 to INS6 may include an inorganic layer or an organic layer. In an embodiment, for example, the inorganic layer of the insulating layer may include at least one of aluminum oxide, titanium oxide, silicon oxide, silicon nitride, silicon oxynitride, zirconium oxide, and hafnium oxide. The organic layer of the insulating layer may include a phenol-based polymer, an acrylic-based polymer, an imide-based polymer, an aryl ether-based polymer, an amide-based polymer, a fluorine-based polymer, a p-xylene-based polymer, a vinyl alcohol-based polymer, and a polymer using a combination thereof. However, the material of the insulating layer is not limited to the above example.

The first insulating layer INS1 may be disposed on the buffer layer BFL to cover the semiconductor pattern of the transistor TR. The first insulating layer INS1 may be disposed between the channel Aa and the gate Ga of the transistor TR.

The gate Ga may be disposed on the first insulating layer INS1. The gate Ga may be a portion of the conductive pattern of the circuit layer DP-CL. In the plan view, the gate Ga may overlap the channel Aa of the transistor TR. In the process of doping the semiconductor pattern, the gate Ga may function as a mask in a process of providing elements of the display panel DP.

The transistor TR of FIG. 5 is merely an example, and the source Sa or the drain Da may be electrodes independent from the semiconductor pattern. In this case, the source Sa and the drain Da may be in contact with the semiconductor pattern of the transistor TR or may pass through the insulating layer to be connected to the semiconductor pattern. Also, in an embodiment, the gate Ga may be disposed under the semiconductor pattern. The transistor TR according to an embodiment may have various structures, but is not limited to any one embodiment.

The second insulating layer INS2 may be disposed on the first insulating layer INS1 to cover the gate Ga. The third insulating layer INS3 may be disposed on the second insulating layer INS2. In an embodiment, each of the first to third insulating layers INS1 to INS3 may be an inorganic layer having a single-layer or multi-layer structure, but is not limited thereto.

The connection electrode CNE may include a first connection electrode CNE1 and a second connection electrode CNE2, to connect the transistor TR to the light emitting element OLE. The first connection electrode CNE1 may be disposed on the third insulating layer INS3 and be connected to the drain Da through a first contact hole CH1 passing through the first to third insulating layers INS1 to INS3. A fourth insulating layer INS4 may be disposed on the first connection electrode CNE1.

The fifth insulating layer INS5 may be disposed on the fourth insulating layer INS4. The second connection electrode CNE2 may be disposed on the fifth insulating layer INS5. The second connection electrode CNE2 may be connected to the first connection electrode CNE1 through the second contact hole CH2 passing through the fourth and fifth insulating layers INS4 and INS5. A sixth insulating layer INS6 may be disposed on the fifth insulating layer INS5 to cover the second connection electrode CNE2.

At least one of the first connection electrode CNE1 and the second connection electrode CNE2 may be omitted. Alternatively, according to an embodiment, an additional connection electrode connecting the light emitting element OLE to the transistor TR may be further disposed. The electrical connection method between the light emitting element OLE and the transistor TR may be variously changed according to the number of insulating layers disposed between the light emitting element OLE and the transistor TR, but is limited to one embodiment.

The display element layer DP-OL may be disposed on the circuit layer DP-CL. The display element layer DP-OL may include the light emitting element OLE and a pixel defining layer PDL. The light emitting element OLE may be electrically connected to the transistor TR to constitute the pixel PX and may be disposed on the display area DP-DA to emit light. In an embodiment, for example, the light emitting element OLE may include an organic light emitting element, a quantum dot light emitting element, a micro LED light emitting element, or a nano LED light emitting element. However, this embodiment is not limited thereto, and the light emitting element OLE may include various embodiments as long as light is generated, or the amount of light is controlled according to an electrical signal.

The light emitting element OLE may include a first electrode AE, a hole control layer HCL, an emission layer EML, an electron control layer ECL, and a second electrode CE. The first electrode AE may be disposed on the sixth insulating layer INS6. The first electrode AE may be connected to the second connection electrode CNE2 through a contact hole passing through the sixth insulating layer INS6.

The pixel defining layer PDL may be disposed on the first electrode AE and the sixth insulating layer INS6 and may expose at least a portion of the first electrode AE. That is, the pixel defining layer PDL may define a light emitting opening PX_OP exposing at least a portion of the first electrode AE to outside the pixel defining layer PDL. A portion of the first electrode AE exposed by the light emitting opening PX_OP may correspond to the emission area PA.

The pixel defining layer PDL may be made of (or include) a polymer resin. In an embodiment, for example, the pixel defining layer PDL may include a polyacrylate-based resin or a polyimide-based resin. The pixel defining layer PDL may further include an inorganic material in addition to the polymer resin. This embodiment is not limited thereto, and the pixel defining layer PDL may be made of an inorganic material. In an embodiment, for example, the pixel defining layer PDL may include silicon nitride ($SiN_x$), silicon oxide ($SiO_x$), silicon oxynitride ($SiO_xN_y$), or the like.

In an embodiment, the pixel defining layer PDL may include a light absorbing material. The pixel defining layer PDL may include a black coloring agent. The black coloring agent may include a black dye and a black pigment. The black coloring agent may include carbon black, a metal such as chromium, or oxide thereof.

The emission layer EML may be disposed on the first electrode AE. The emission layer EML may be disposed to correspond to the light emitting opening PX_OP of the pixel defining layer PDL. However, this embodiment is not limited thereto, and the emission layer EML may extend toward a top surface of the pixel defining layer PDL and may be commonly disposed in the plurality of pixels PX.

The emission layer EML may provide color light. The emission layer EML may include an organic light emitting material and/or an inorganic light emitting material. In an embodiment, for example, the emission layer EML may include a fluorescent or phosphorescent material, a metal organic complex light emitting material, or quantum dots. FIG. 5 illustrates an example of the patterned single-layer emission layer EML, but is not limited thereto. In an embodiment, for example, the emission layer EML may have a multi-layer structure. In an embodiment, for example, the emission layer EML may include a main emission layer and an auxiliary emission layer which is disposed on the main emission layer. The main emission layer and the auxiliary emission layer may have different thicknesses according to a wavelength of the emitted light, and a resonance distance of the light emitting element OLE may be adjusted by disposing the auxiliary emission layer In addition, color purity of light output from the emission layer EML may be improved by disposing the auxiliary emission layer.

The second electrode CE may be disposed on the emission layer EML. The second electrode CE may be commonly disposed in the pixels PX. A common voltage may be provided to the second electrode CE, and the second electrode CE may be referred to as a common electrode.

The light emitting element OLE may further include light emitting functional layers disposed between the first electrode AE and the second electrode CE. In an embodiment, for example, the light emitting element OLE may further include a hole control layer HCL disposed between the first electrode AE and the emission layer EML, and an electron control layer ECL disposed between the emission layer EML and the second electrode CE. The hole control layer HCL and the electron control layer ECL may be commonly disposed in the plurality of pixels PX.

A first voltage may be applied to the first electrode AE through the transistor TR, and a common voltage may be applied to the second electrode CE through the transistor TR. Holes and electrons injected into the emission layer EML may be coupled to form an exciton, and while the exciton is transitioned to a ground state, the light emitting element OLE may emit light through the display area DP-DA.

The encapsulation layer TFE may be disposed on the display element layer DP-OL to cover the light emitting element OLE. That is, the encapsulation layer TFE may encapsulate the light emitting element OLE. The encapsulation layer TFE may include a plurality of encapsulation films EN1 to EN3, and each of the encapsulation films EN1 to EN3 may include an inorganic film or an organic film.

In an embodiment, each of the first encapsulation film EN1 and the third encapsulation film EN3 may include an inorganic film and may protect the light emitting element OLE from moisture and/or oxygen. In an embodiment, for example, the inorganic film may include at least one of aluminum oxide, titanium oxide, silicon oxide, silicon nitride, silicon oxynitride, zirconium oxide, and hafnium oxide, but the material of the inorganic film is not limited thereto.

In an embodiment, the second encapsulation film EN2 may include an organic film and may protect the light emitting element OLE from foreign substances such as dust particles. In an embodiment, for example, the organic film may include an acrylic resin, but the material of the organic film is not limited thereto.

The input sensor IS may be disposed on the display panel DP. The input sensor IS may be directly disposed on the display panel DP without a separate adhesive member. That is, after the display panel DP is formed, the input sensor IS may be formed on the base surface provided by the display panel DP through a continuous process. However, this embodiment is not limited thereto, and the input sensor IS may be manufactured in the form of a panel through a separate process different from that of the display panel DP, to provide an independent element from the display panel DP and then be attached to the display panel DP such as by an adhesive member.

The input sensor IS may include a base insulating layer BS, a first conductive pattern CTL1, a second conductive pattern CTL2, and a sensing insulating layer TINS.

The base insulating layer BS may be disposed on the encapsulation layer TFE. The base insulating layer BS may be in contact with the third encapsulation film EN3 that is the uppermost layer of the encapsulation layer TFE. The base insulating layer BS may include an inorganic layer.

The first conductive pattern CTL1 may be disposed on the base insulating layer BS. The sensing insulating layer TINS may be disposed on the base insulating layer BS to cover the first conductive pattern CTL1. The sensing insulating layer TINS may include an inorganic layer or an organic layer. The second conductive pattern CTL2 may be disposed on the sensing insulating layer TINS.

The first and second conductive patterns CTL1 and CTL2 may be disposed to overlap the non-emission area NPA. The first and second conductive patterns CTL1 and CTL2 may have a mesh-shaped pattern disposed to correspond to the non-emission area NPA. That is, solid portions of the conductive patterns which are spaced apart from each other may correspond to the non-emission area NPA, while spaces between the solid portions correspond to the emission area PA. Thus, the input sensor IS may not affect luminous efficiency of the light emitting element OLE. However, this embodiment is not limited thereto, and the input sensor IS may overlap the light emitting elements OLE and include a single-shaped (solid) pattern including a conductive transparent material.

The first and second conductive patterns CTL1 and CTL2 may form sensors of the input sensor IS. In an embodiment, for example, the mesh-shaped first and second conductive patterns CTL1 and CTL2 may be separated from each other in a region to form electric fields for sensing an external input. A portion of the second conductive pattern CTL2 may be connected to the first conductive pattern CTL1.

The anti-reflection layer RPL may be disposed on the input sensor IS. The anti-reflection layer RPL may reduce reflectance of external light to improve light output efficiency of the display panel DP. In an embodiment, the anti-reflection layer RPL may be directly disposed on the input sensor IS. The anti-reflection layer RPL may include a barrier layer BM, color filters CF (e.g., color filter layer including a plurality of color filters), and an overcoat layer PINS.

The barrier layer BM may be disposed on the sensing insulating layer TINS to cover the second conductive pattern CTL2. This embodiment is not limited thereto, and the input sensor IS may further include a separate insulating layer covering the second conductive pattern CTL2, and the barrier layer BM may be disposed on the separate insulating layer.

The barrier layer BM may define a barrier opening B_OP overlapping the emission area PA and the light emitting opening PX_OP. An opening may have an area defined by a product of dimensions taken in different directions, such as the first direction DR1 and the second direction DR2. A size of the area may be indicated by a dimension along one of the directions. Referring to FIG. 5, for example, an area of the barrier opening B_OP may be larger than that of the light emitting opening PX_OP, on the plane.

The barrier layer BM may block light by absorbing light. The barrier layer BM may include a light absorbing material. The barrier layer BM may have a black color and may include a black component. The black component may include a black dye and a black pigment. The black component may include carbon black, a metal such as chromium, or oxide thereof.

The color filters CF may be disposed on the sensing insulating layer TINS and the barrier layer BM. The color filters CF may be disposed to correspond to the barrier opening B_OP. The color filters CF may be disposed to overlap the emission area PA. The color filters CF may absorb light of a specific wavelength region according to a color of the light emitted through the emission area PA.

The overcoat layer PINS may be disposed on the color filters CF. The overcoat layer PINS may include an organic material. The overcoat layer PINS may cover the color filters CF and provide a flat top surface. In an embodiment, the overcoat layer PINS may be omitted.

When the external light traveling toward the display panel DP is reflected from the display panel DP and provided again to outside the display panel DP, the external light may be visually recognized from the outside. To reduce or effectively prevent this phenomenon from occurring, the anti-reflection layer RPL may include color filters CF that display substantially the same color as the pixels PX. Thus, the color filters CF may filter external light with the same colors as the pixels PX, and reflectance of the external light may be reduced.

However, this embodiment is not limited thereto, and the anti-reflection layer RPL may include a polarizing film to reduce the reflectance of the external light. The polarizing film may be separately manufactured and attached on the input sensor IS by an adhesive member. The polarizing film may include a retarder and/or a polarizer.

Figure 6A:
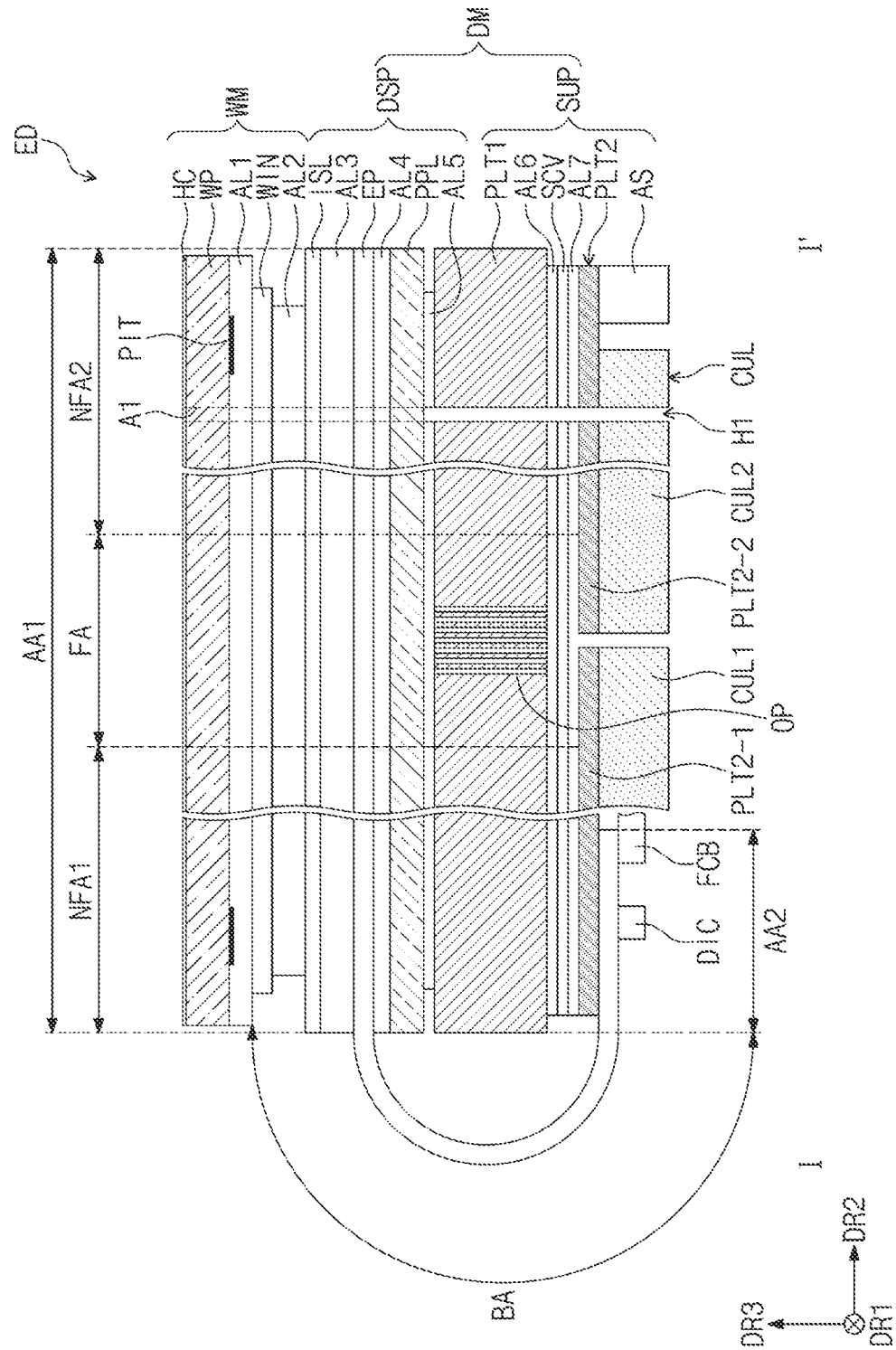
FIGS. 6A and 6B are cross-sectional views taken along line I-I' of FIG. 2 in the electronic apparatus according to an embodiment.
Figure 6B:
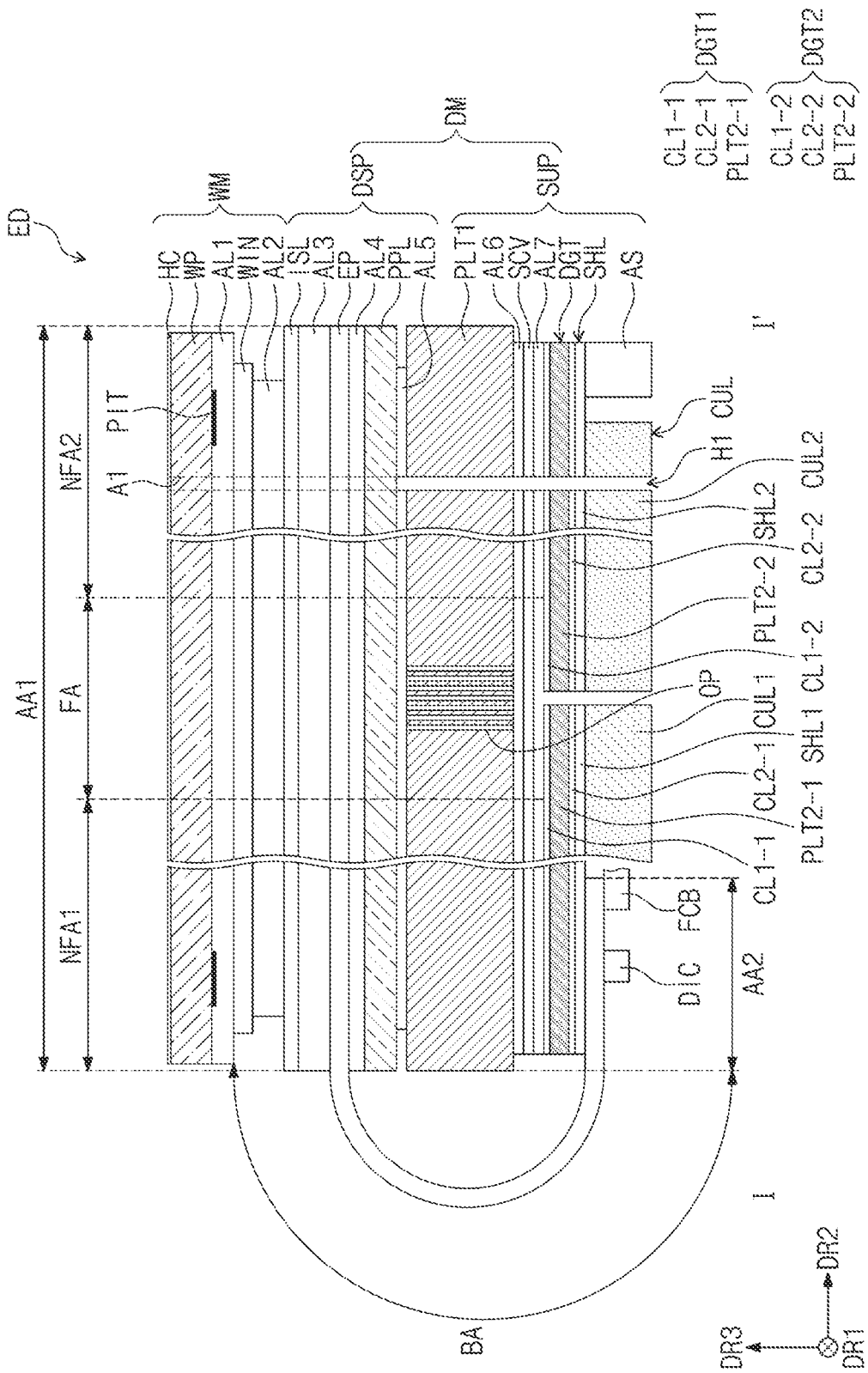

FIGS. 6A and 6B are cross-sectional views taken along line I-I' of FIG. 2 in the electronic apparatus ED according to an embodiment. FIGS. 6A and 6B illustrate a laminated structure of the window module WM and the display module DM among the components of the electronic apparatus ED of FIG. 2, and configurations corresponding to the electronic modules EM1 and EM2, the power supply module PM, and the cases EDC1 and EDC2 are omitted without being shown.

Referring to FIG. 6A, the electronic apparatus ED may include the display module DM and the window module WM which is disposed on (or facing) the display module DM. The display module DM may include a display part DSP and a support part SUP. The support part SUP may be disposed under the display part DSP to support the display part DSP. That is, the support part SUP may face the window module WM with the display part DSP therebetween.

The display module DM may be a flexible display module. The display module DM may include a first non-folding area NFA1, a folding area FA, and a second non-folding area NFA2. As the folding area FA is foldable about one or more folding axis, the display module DM may be folded at the folding area FA.

The window module WM may include a window WIN, a window protective layer WP, a hard coating layer HC, and first and second adhesive layers AL1 and AL2.

The window WIN may be disposed on the display module DM. The window WIN may protect the electronic panel EP from external scratches. The window WIN may include an optically transparent material. In an embodiment, for example, the window WIN may include glass, and specifically, the window WIN may include tempered glass. However, the embodiment is not limited thereto, and the window WIN may include a synthetic resin film.

The window WIN may have a single-layer or multi-layer structure. In an embodiment, for example, the window WIN having the multi-layer structure may include a plurality of plastic films bonded to each other by using an adhesive or include a glass substrate and a plastic film, which are bonded to each other by using an adhesive.

The window protective layer WP may be disposed on the window WIN. The window protective layer WP may include an organic material. In an embodiment, for example, the window protective layer WP may include at least one of polyimide, polycarbonate, polyamide, triacetylcellulose, polymethylmethacrylate, and polyethylene terephthalate. However, the material of the window protective layer WP is not limited to the above example.

The hard coating layer HC may be disposed on the window protective layer WP. The hard coating layer HC may supplement rigidity of the window module WM and provide a flat top surface. The hard coating layer HC may include at least one functional layer. In an embodiment, for example, the functional layer may include an anti-fingerprint layer, an anti-reflection layer, and the like.

A bezel pattern PIT may be disposed on a bottom surface of the window protective layer WP. However, the invention is not limited thereto, and the bezel pattern PIT may be disposed on a top or bottom surface of the window WIN. The bezel pattern PIT may be formed by coating, printing, or the like. An area on which the bezel pattern PIT is disposed may correspond to the peripheral area F-NAA (see FIG. 1A) of the electronic apparatus ED. The bezel pattern PIT may include a colored light blocking layer. The bezel pattern PIT may prevent the components of the electronic panel EP disposed to overlap the bezel pattern PIT from being visually recognized from the outside.

The first adhesive layer AL1 may be disposed between the window WIN and the window protective layer WP to couple the window WIN to the window protective layer WP. The first adhesive layer AL1 may cover the bezel pattern PIT. The second adhesive layer AL2 may be disposed on the bottom surface of the window WIN to allow the window WIN to adhere to the display module DM.

The display part DSP of the display module DM may include an electronic panel EP, an impact absorbing layer ISL, a panel protective layer PPL, and third to fifth adhesive layers AL3 to AL5. For the description of the electronic panel EP, the description of the display module DM described above with reference to FIG. 5 may be applied, and a detailed description of the electronic panel EP will be omitted.

The impact absorbing layer ISL may be disposed on the electronic panel EP. The impact absorbing layer ISL may protect the electronic panel EP by absorbing an external impact applied from the upper portion of the electronic apparatus ED and in a direction toward the electronic panel EP. The impact absorbing layer ISL may be coupled to the electronic panel EP by the third adhesive layer AL3 disposed between the electronic panel EP and the impact absorbing layer ISL. However, this embodiment is not limited thereto, and the impact absorbing layer ISL may be directly disposed on the electronic panel EP or may be omitted.

The impact absorbing layer ISL may include a synthetic resin film. In an embodiment, for example, the impact absorbing layer ISL may include at least one of polyamide and polyethylene terephthalate. However, the material of the impact absorbing layer ISL is not limited to the above example.

The panel protective layer PPL may be disposed under the electronic panel EP. The panel protective layer PPL may be coupled to a rear surface of the electronic panel EP by the fourth adhesive layer AL4 disposed between the panel protective layer PPL and the electronic panel EP. The panel protective layer PPL may protect a lower portion of the display panel DP. The panel protective layer PPL may prevent scratches on the rear surface of the electronic panel EP during a process of manufacturing the electronic panel EP.

The panel protective layer PPL may include a synthetic resin film. In an embodiment, for example, the panel protective layer PPL may include at least one of polyamide and polyethylene terephthalate. However, the material of the panel protective layer PPL is not limited to the above example.

The fifth adhesive layer AL5 may be disposed between the panel protective layer PPL and the support part SUP to couple the panel protective layer PPL on the top surface of the support part SUP. The fifth adhesive layer AL5 may overlap the first and second non-folding areas NFA1 and NFA2 and may not overlap the folding area FA. The fifth adhesive layer AL5 may be disconnected at the folding area FA. That is, the fifth adhesive layer AL5 may not be disposed on the folding area FA, and thus, flexibility of the support part SUP may be improved.

The electronic panel EP which is bent at the bending area BA, may dispose the data driver DIC and the circuit board FCB in the panel second area AA2 of the electronic panel EP, to overlap the first panel area AA1 on the plane. The electronic apparatus ED which is bent at the bending area BA of the electronic panel EP, the panel second area AA2 of the electronic panel EP may be disposed under a second support plate PLT2.

The support part SUP includes a support plate (e.g., a first support plate PLT1 and the second support plate PLT2), a cover layer SCV, a cushion layer CUL, a step compensation part AS, sixth and seventh adhesive layers AL6 and AL7.

The first support plate PLT1 may be disposed under the display part DSP to support the display part DSP. The first support plate PLT1 may support the electronic panel EP of the display part DSP. The first support plate PLT1 may be provided as an integral plate overlapping each of the first non-folding area NFA1, the second non-folding area NFA2, and the folding area FA.

An opening OP provided in plural including a plurality of openings OP overlapping the folding area FA, may be defined in the first support plate PLT1. The plurality of openings OP may be defined to pass through a portion of the first support plate PLT1 overlapping the folding area FA, along or in the third direction DR3. Flexibility of a portion of the first support plate PLT1 corresponding to the folding area FA may be improved by the plurality of openings OP. A detailed description thereof will be described later with reference to FIGS. 7A and 7B.

The first support plate PLT1 may have predetermined rigidity. A modulus of the first support plate PLT1 may be relatively greater than a modulus of the display part DSP. Thus, when the electronic apparatus ED is folded at the folding area FA, a shape of the display part DSP may be folded to substantially correspond to the shape of the first support plate PLT1. That is, the display part DSP and the first support plate PLT1 may be foldable together with each other, to have corresponding folded shapes.

The first support plate PLT1 may include a reinforcing fiber composite. In an embodiment, for example, the reinforcing fiber composite may be carbon fiber reinforced plastic (CFRP) or glass fiber reinforced plastic (GFRP). However, this embodiment is not limited thereto, and the first support plate PLT1 may include plastic or stainless steel.

The cover layer SCV may be disposed under the first support plate PLT1. The cover layer SCV may be coupled to a rear surface of the first support plate PLT1 by the sixth adhesive layer AL6 disposed between the first support plate PLT1 and the cover layer SCV. The cover layer SCV may be manufactured in the form of a sheet and attached to the first support plate PLT1.

The cover layer SCV may cover the plurality of openings OP of the first support plate PLT1. The cover layer SCV may prevent foreign substances from being introduced into the plurality of openings OP. Although FIG. 6A illustrates an example of the integrated cover layer SCV overlapping the first and second non-folding areas NFA1 and NFA2 and the folding area FA, this embodiment is not limited thereto, and the cover layer SCV may be disposed only on the area corresponding to the folding area FA.

The cover layer SCV may have an elastic modulus less than an elastic modulus of the first support plate PLT1. In an embodiment, for example, the cover layer SCV may include thermoplastic polyurethane, rubber, or silicone. However, the material of the cover layer SCV is not limited to the above example.

The second support plate PLT2 may be disposed under the first support plate PLT1. In an embodiment, the second support plate PLT2 may be disposed under the cover layer SCV. The second support plate PLT2 may include a first plate PLT2-1 overlapping the first non-folding area NFA1 and a second plate PLT2-2 overlapping the second non-folding area NFA2. Each of the first plate PLT2-1 and the second plate PLT2-2 may overlap a portion of the folding area FA. The first plate PLT2-1 and the second plate PLT2-2 may be disconnected from each other to be spaced apart from each other in the second direction DR2, at the folding area FA.

Since the first plate PLT2-1 and the second plate PLT2-2 are spaced apart from each other under the folding area FA, the second support plate PLT2 may be easily folded. When the electronic apparatus ED is in the folded state, the first plate PLT2-1 and the second plate PLT2-2 may be spaced apart from each other with a central portion of the folding area FA therebetween, and thus, the second support plate PLT2 may be easily folded without deformation corresponding to a curvature of the central portion of the folding area FA.

The second support plate PLT2 may be coupled to the cover layer SCV, by the seventh adhesive layer AL7 disposed between the cover layer SCV and the second support plate PLT2. The seventh adhesive layer AL7 may overlap the first and second non-folding areas NFA1 and NFA2 and may not overlap the folding area FA (e.g., may be disconnected at the folding area FA). A portion of the seventh adhesive layer AL7 overlapping the first non-folding area NFA1 may couple the first plate PLT2-1 to the cover layer SCV, and a portion of the seventh adhesive layer AL7 overlapping the second non-folding area NFA2 may couple the second plate PLT2-2 to the cover layer SCV. Since the seventh adhesive layer AL7 is not disposed on the folding area FA, the flexibility of the second support plate PLT2 may be maintained.

Each of the first to seventh adhesive layers AL1 to AL7 may include a transparent adhesive such as a pressure sensitive adhesive (PSA) or an optically clear adhesive (OCA), but the type of adhesive is not limited thereto.

Each of the first plate PLT2-1 and the second plate PLT2-2 may have predetermined rigidity. Each of the first plate PLT2-1 and the second plate PLT2-2 may include a material having relatively large resistance with respect to compression force such as external pressing. In an embodiment, for example, each of the first plate PLT2-1 and the second plate PLT2-2 may include a reinforcing fiber composite material. In an embodiment, for example, the reinforcing fiber composite may be carbon fiber reinforced plastic (CFRP) or glass fiber reinforced plastic (GFRP). Thus, the first plate PLT2-1 and the second plate PLT2-2 may prevent the stepped portion of the constituents of the circuit board FCB, which is disposed to overlapping a portion of the second support plate PLT2 while being combined with the constitutes of the electronic apparatus ED, from being visually recognized from the outside.

A flexural modulus of each of the first plate PLT2-1 and the second plate PLT2-2 may be about 10 gigapascals (GPa) or more and about 50 gigapascals (GPa) or less. When the flexural modulus of each of the first plate PLT2-1 and the second plate PLT2-2 is less than about 10 GPa, the first plate PLT2-1 and the second plate PLT2-2 may be deformed by the compression force, or the stepped portion of the circuit board FCB may be visually recognized from the outside. When the flexural modulus of each of the first plate PLT2-1 and the second plate PLT2-2 is greater than about 50 GPa, the flexibility may be deteriorated and may not be folded to correspond to the shape of the first support plate PLT1 or damaged when folded.

A thickness of each of the first plate PLT2-1 and the second plate PLT2-2 may be designed in consideration of a design of the electronic apparatus ED, mechanical properties of the electronic apparatus ED, and stacked positions of the first plate PLT2-1 and the second plate PLT2-2. In an embodiment, for example, each of the first plate PLT2-1 and the second plate PLT2-2 may have a thickness of about 30 micrometers (μm) to about 150 micrometers (μm). When the thickness of each of the first plate PLT2-1 and the second plate PLT2-2 is less than about 30 μm, the rigidity of the plate may be reduced, and the plate may be deformed by the compression force, or the stepped portion of the circuit board FCB may be visually recognized from the outside. When the thickness of each of the first plate PLT2-1 and the second plate PLT2-2 is greater than about 150 μm, the flexibility may be reduced. Also, when the thickness of each of the first plate PLT2-1 and the second plate PLT2-2 is greater than about 150 μm, the thickness of the electronic apparatus ED may increase.

Each of the first plate PLT2-1 and the second plate PLT2-2 may have color that absorbs light. In an embodiment, for example, each of the first plate PLT2-1 and the second plate PLT2-2 may have a black color. As a result, the components disposed under the second support plate PLT2 may be prevented from being visually recognized from the outside. However, this embodiment of the first plate PLT2-1 and the second plate PLT2-2 is not necessarily limited thereto.

Each of the first support plate PLT1 and the second support plate PLT2 may include a reinforcing fiber composite, and thus, the thickness of each of the first support plate PLT1 and the second support plate PLT2 may be easily adjusted. Specifically, the thickness of each of the first support plate PLT1 and the second support plate PLT2 including the reinforcing fiber composite material may be easily adjusted by controlling lamination of the reinforcing fibers and a thickness of the matrix part. In addition, since each of the first support plate PLT1 and the second support plate PLT2 includes a reinforcing fiber composite material, plate shape processing may be easier compared to a metal support plate.

The first support plate PLT1 and the second support plate PLT2 may be reduced in weight by including the reinforcing fiber composite material. Each of the first support plate PLT1 and the second support plate PLT2 according to an embodiment includes the reinforcing fiber composite material and thus have a light weight compared to the metal support plate using a metal material and have a modulus and strength similar to that of the metal support plate.

The cushion layer CUL may include a first cushion layer CUL1 disposed under the first plate PLT2-1, and a second cushion layer CUL2 disposed under the second plate PLT2-2. The first cushion layer CUL1 and the second cushion layer CUL2 may absorb an external impact to protect the electronic panel EP. Each of the first cushion layer CUL1 and the second cushion layer CUL2 may include a foam sheet having predetermined elastic force. In an embodiment, for example, each of the first cushion layer CUL1 and the second cushion layer CUL2 may include sponge or polyurethane. Each of the first cushion layer CUL1 and the second cushion layer CUL2 may be directly coated under the second support plate PLT2 or may adhere through a separate adhesive layer.

The step compensation part AS may be disposed under the second support plate PLT2. The step compensation part AS may be disposed outside the cushion layer CUL. The step compensation part AS may be provided in the form of a double-sided tape or an insulating film. In an embodiment, the step compensation part AS may include a waterproof tape. The step compensation part AS may be provided by being attached to a set bracket of the electronic apparatus ED.

A through hole H1 may be defined in the constituents of the support part SUP. The through hole H1 may be defined by passing through the constituents of the support part SUP in an area corresponding the signal transmission area TA (see FIG. 1A) and the first area A1. At least a portion of the camera module CMM (see FIG. 2) of the electronic apparatus ED may be inserted into the through hole H1. However, this embodiment is not limited thereto, and the through hole H1 in the support part SUP may not be defined according to a position of the camera module CMM (see FIG. 2).

The laminated configurations of the electronic apparatus ED illustrated in FIG. 6A are merely an example, and the laminating order among some of the constituents may be changed or omitted. This embodiment is not limited thereto, and an additional constituent may be further disposed in the electronic apparatus ED. In an embodiment, for example, an another input sensor detecting a second external input that is different from a first external input detected by the input sensor IS (see FIG. 5) of the electronic panel EP, and disposed between the first support plate PLT1 and the second support plate PLT2, may be further disposed. In an embodiment, for example, the input sensor IS (see FIG. 5) of the electronic panel EP may detect an external input (e.g., a first external input), and another input sensor may detect an input of an electromagnetic pen PN as a second external input (see FIG. 1A).

The electronic apparatus ED of FIG. 6B includes substantially the same configuration as the embodiment of the electronic apparatus ED illustrated in FIG. 6A, but there are differences in some configurations. Hereinafter, differences between the embodiments will be mainly described.

The display module DM of the electronic apparatus ED according to an embodiment may further include a digitizer DGT and a shielding layer SHL. The digitizer DGT and the shielding layer SHL may be provided as constituents of the support part SUP of the display module DM. The digitizer DGT according to an embodiment may be mounted on the above-described second support plate PLT2. Hereinafter, this will be described in detail.

The digitizer DGT may be disposed under the first support plate PLT1. In an embodiment, the digitizer DGT may be disposed under the cover layer SCV. The digitizer DGT may include a first sensing part DGT1 and a second sensing part DGT2 spaced apart from each other.

The digitizer DGT may receive location information indicated at the display surface FS (see FIG. 1A) of the electronic apparatus ED. In an embodiment, the digitizer DGT may be implemented in an electromagnetic manner (or electromagnetic resonance manner). In an embodiment, for example, the digitizer DGT may include a sensor substrate on which a plurality of coils generating magnetic fields having a resonant frequency with an electromagnetic pen PN (see FIG. 1A) are mounted. The digitizer DGT may detect the position of the electromagnetic pen PN (see FIG. 1A) by detecting an electromagnetic change generated by the approach of the electromagnetic pen PN (see FIG. 1A) relative to the electronic apparatus ED.

The magnetic fields generated in the first sensing part DGT1 and the second sensing part DGT2 may be applied to an LC resonance circuit composed of an inductor (coil) and a capacitor of the electromagnetic pen PN (see FIG. 1A). The coils may generate (electrical) current by the received magnetic fields and transfer the generated current to the capacitor. Thus, the capacitor charges the current input from the coil and discharges the charged current to the coil. As a result, the magnetic fields of the resonant frequency are emitted to the coil. The magnetic field emitted by the electromagnetic pen PN (see FIG. 1A) may be absorbed again by the coil of the digitizer DGT, and thus, the digitizer DGT may determine where position of the electromagnetic pen PN (see FIG. 1A) is adjacent to the first sensing part DGT1 and the second sensing part DGT2.

Since the first support plate PLT1 adjacent to the digitizer DGT includes the reinforcing fiber composite material, sensitivity and reliability of the digitizer DGT may be improved. If the first support plate PLT1 adjacent to the digitizer DGT includes a metal material, electromagnetic signals transmitted on the electronic apparatus ED may be blocked by an interference by the metal support plate. In this case, the sensitivity of the digitizer DGT may be reduced.

In an embodiment, the digitizer DGT may have portions that are substantially curved by the plurality of coils. Since the first support plate PLT1 includes the reinforcing fiber composite material, it is possible to prevent the curved of the plurality of coils of the digitizer DGT from being transferred upward within the stacked structure of the electronic apparatus ED. Thus, it is possible to prevent the digitizer DGT from being visually recognized from the upper side of the electronic apparatus ED.

The first sensing part DGT1 may be disposed to overlap the first non-folding area NFA1. The second sensing part DGT2 may be disposed to overlap the second non-folding area NFA2. Each of the first sensing part DGT1 and the second sensing part DGT2 may overlap a portion of the folding area FA. The first sensing part DGT1 and the second sensing part DGT2 may be spaced apart from each other under the folding area FA.

Each of the first sensing part DGT1 and the second sensing part DGT2 may be mounted on the second support plate PLT2. That is, the second support plate PLT2 may be provided as a sensor substrate of the digitizer DGT, and a plurality of coils constituting the digitizer DGT may be directly disposed on the second support plate PLT2. Specifically, the first sensing part DGT1 may include a first plate PLT2-1 provided as a sensor substrate, a first conductive layer CL1-1 disposed on one surface of the first plate PLT2-1, and a second conductive layer CL2-1 disposed on the other surface of the first plate PLT2-1. The second sensing part DGT2 may include a second plate PLT2-2 provided as the sensor substrate, a first conductive layer CL1-2 disposed on one surface of the second plate PLT2-2, and a second conductive layer CL2-2 disposed on the other surface of the second plate PLT2-2.

Each of the first conductive layers CL1-1 and CL1-2 and the second conductive layers CL2-1 and CL2-2 may include a metal material. In an embodiment, for example, each of the first conductive layers CL1-1 and CL1-2 and the second conductive layers CL2-1 and CL2-2 may include gold (Au), silver (Ag), copper (Cu), aluminum (Al) or the like. However, the materials of the first conductive layers CL1-1 and CL1-2 and the second conductive layers CL2-1 and CL2-2 are not limited to the above example. Each of the first conductive layers CL1-1 and CL1-2 and the second conductive layers CL2-1 and CL2-2 may include a plurality of coils and terminals connected to the coils. The configuration of the coils and terminals will be described in detail later.

Since the first plate PLT2-1 and the second plate PLT2-2 are provided as the sensor substrates of the first sensing part DGT1 and the second sensing part DGT2, respectively, an arrangement of an additional substrate may be omitted, and the laminated configuration of the electronic apparatus ED may be simplified. In addition, as the laminated configuration of the electronic apparatus ED is simplified, the thickness and weight of the electronic apparatus ED may be reduced, and manufacturing costs of the electronic apparatus ED may be reduced.

The first sensing part DGT1 and the second sensing part DGT2 may include the first plate PLT2-1 and the second plate PLT2-2, respectively, each of which includes the reinforcing fiber composite. Thus, each of the first sensing part DGT1 and the second sensing part DGT2 may be improved in strength, and a portion of each of the first sensing part DGT1 and the second sensing part DGT2 may be easily bent to correspond to the folded shape of the first support plate PLT1. This will be described in detail later.

The shielding layer SHL may be disposed under the digitizer DGT. The shielding layer SHL may include a first shielding layer SHL1 and a second shielding layer SHL2 coupled to the first sensing part DGT1 and the second sensing part DGT2, respectively. The shielding layer SHL may block electromagnetic waves generated from the electronic modules EM1 and EM2 (see FIG. 2) from affecting the digitizer DGT as noise. The shielding layer SHL may include a metal material such as copper. In an embodiment, the shielding layer SHL may include a magnetic metal powder layer (MMP). In an embodiment, the magnetic metal powder layer of the shielding layer SHL may be directly formed on a bottom surface of the digitizer DGT through a coating and curing process. However, the material of the shielding layer SHL is not limited to the above example. Also, in an embodiment, the shielding layer SHL may serve as a heat dissipation layer.

Figure 7A:
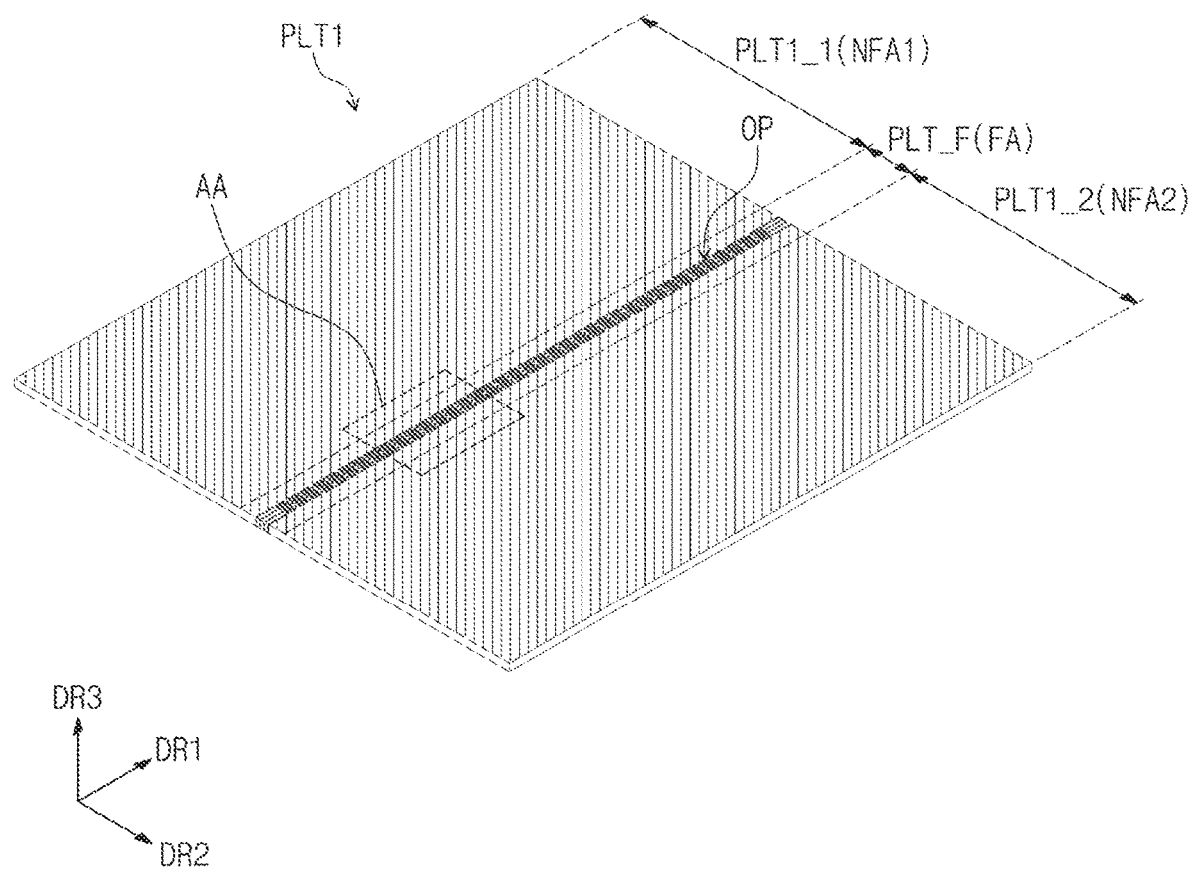
FIG. 7A is a perspective view illustrating a first support plate according to an embodiment.
Figure 7B:
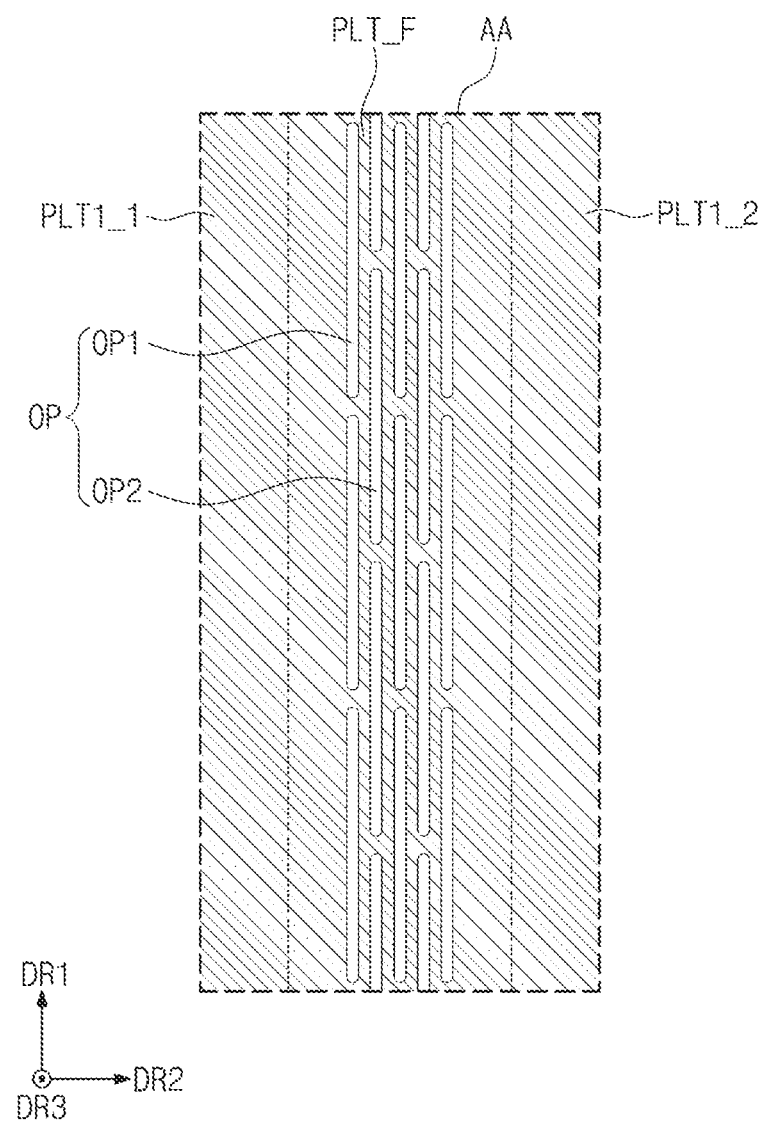
FIG. 7B is an enlarged plan view illustrating an area AA of FIG. 7A in the first support plate according to an embodiment.

FIG. 7A is a perspective view illustrating the first support plate PLT1 according to an embodiment. FIG. 7B is an enlarged plan view illustrating an area AA of FIG. 7A in the first support plate PLT1 according to an embodiment. In FIGS. 7A and 7B, the above-described through hole H1 (see FIG. 6A) is omitted.

Referring to FIGS. 7A and 7B, the first support plate PLT1 includes a first support portion PLT1_1 corresponding to the first non-folding area NFA1, a second support portion PLT1_2 corresponding to the second non-folding area NFA2, and a folding portion PLT_F corresponding to the folding area FA. The folding portion PLT_F may be disposed between the first support portion PLT1_1 and the second support portion PLT1_2, and the first support portion PLT1_1 and the second support portion PLT1_2 may be spaced apart from each other in the second direction DR2. The first supporting portion PLT1_1, the second support portion PLT1_2, and the folding portion PLT_F may have an integrated plate shape.

A lattice pattern may be defined at the folding portion PLT_F. In an embodiment, for example, a plurality of openings OP may be defined in the first support plate PLT1 at the folding portion PLT_F. The plurality of openings OP may be arranged in a lattice shape, and the lattice pattern may be provided on the folding portion PLT_F. A width of the area in which the plurality of openings OP is defined in the second direction DR2, may be less than a width of the folding area FA.

Referring to FIG. 7B, the plurality of openings OP may be provided in a plurality of rows. The plurality of openings OP may be provided in a plurality of rows arranged to be dislocated with respect to each other. In an embodiment, the plurality of openings OP may include a plurality of first openings OP1 and a plurality of second openings OP2, which are arranged to be dislocated with respect to each other in the second direction DR2. Each of the plurality of first openings OP1 arranged in one row may extend in the first direction DR1 and may be spaced apart from each other in the first direction DR1. Each of the plurality of second openings OP2 may be spaced apart from the plurality of first openings OP1 in the second direction DR2. Each of the plurality of second openings OP2 arranged in one row may extend in the first direction DR1 and may be spaced apart from each other in the first direction DR1. However, this is merely an example, and the plurality of openings OP according to an embodiment may all be arranged side by side in the second direction DR2 and are not limited to any one embodiment.

The plurality of openings OP may be defined in various manners. In an embodiment, for example, the plurality of openings OP may be defined through a laser process or a micro-blast process, but is not limited thereto.

An area of the folding portion PLT_F of the first support plate PLT1 may be reduced by the plurality of openings OP. That is, a planar area of a solid portion of the first support plate PLT1 may be reduced by the plurality of openings OP at which a thickness of the solid portion is reduced or omitted. Thus, flexibility of the folding portion PLT_F in which the plurality of openings OP is defined may be improved compared to the case in which the plurality of openings OP are not defined.

Figure 8:
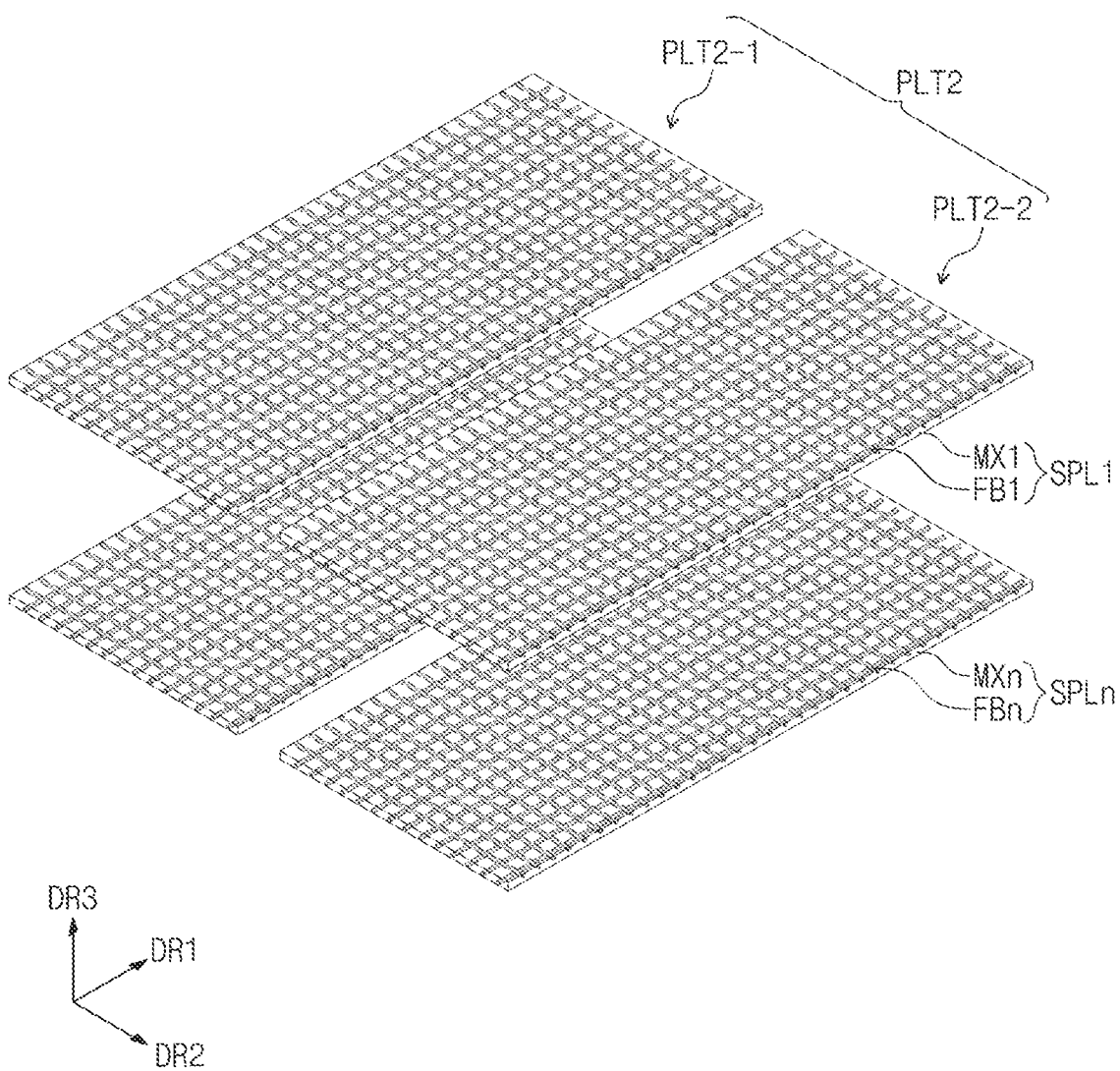
FIG. 8 is an exploded perspective view illustrating a second support plate according to an embodiment.
Figure 9A:
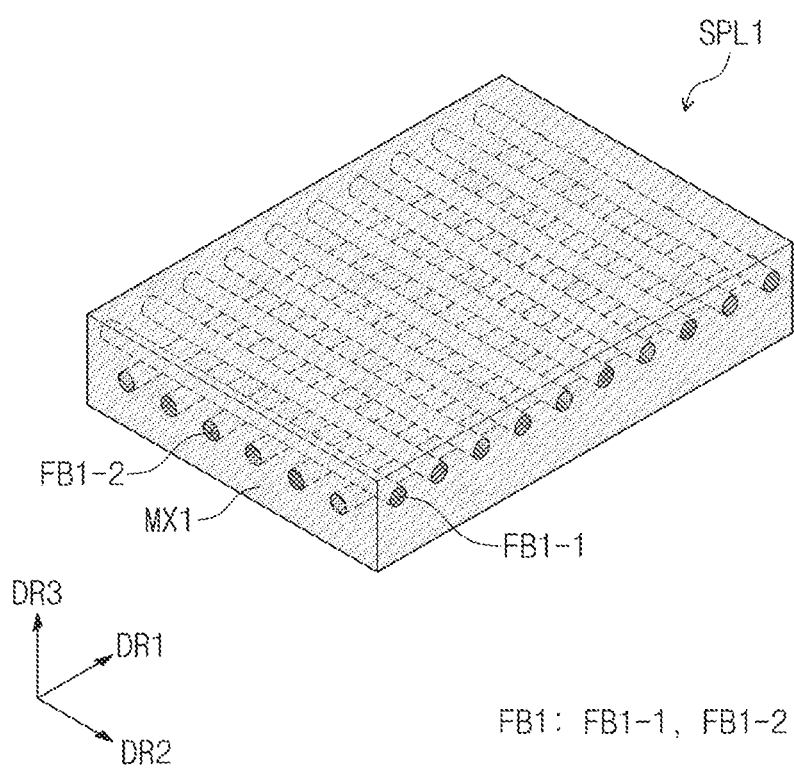
FIGS. 9A and 9B are enlarged perspective views of the second support plate according to an embodiment.
Figure 9B:
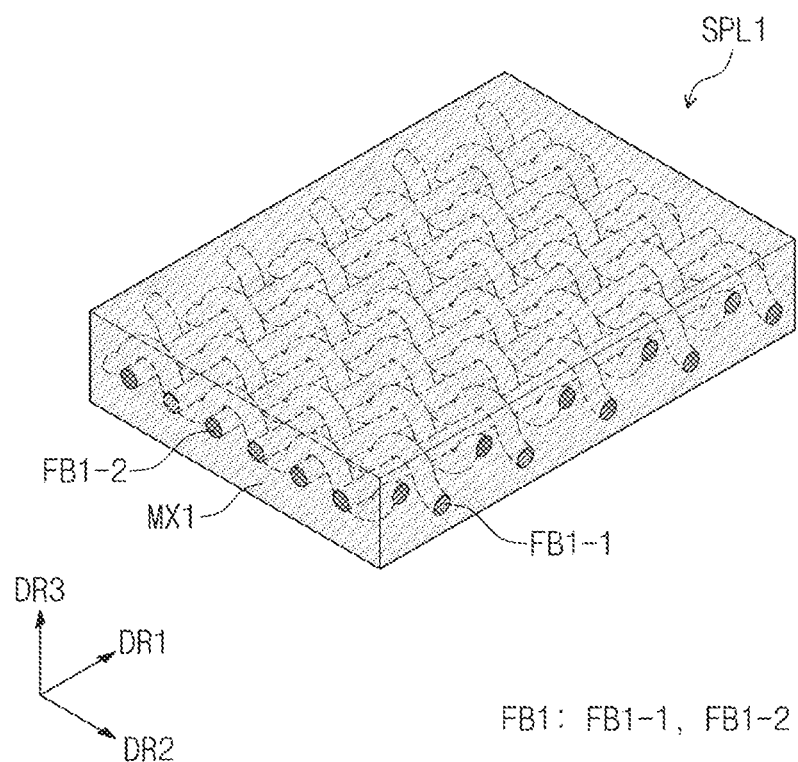
Figure 9C:
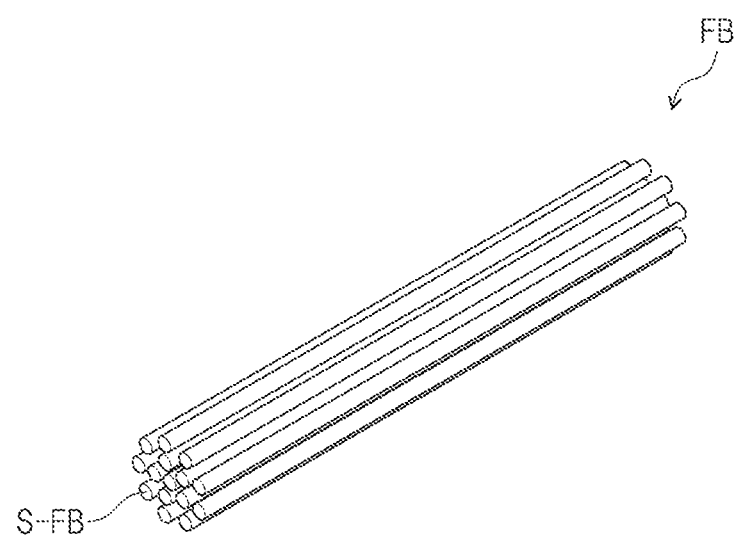
FIG. 9C is an enlarged perspective view of a reinforcing fiber according to an embodiment.

FIG. 8 is an exploded perspective view illustrating the second support plate PLT2 according to an embodiment. FIGS. 9A and 9B are enlarged perspective views of portions of the second support plate PLT2 according to an embodiment. FIG. 9C is an enlarged perspective view of a reinforcing fiber according to an embodiment.

Referring to FIG. 8, the second support plate PLT2 may include a first plate PLT2-1 and a second plate PLT2-2, which are spaced apart from each other in the second direction DR2. The above description may be applied to the description of the first plate PLT2-1 and the second plate PLT2-2.

Each of the first plate PLT2-1 and the second plate PLT2-2 may include a plurality of sub-plates SPL1 to SPLn. The plurality of sub-plates SPL1 to SPLn may be sequentially stacked along the third direction DR3. FIG. 8 illustrates an exploded perspective view of 'n' sub-plates SPL1 to SPLn arranged along the third direction DR3. In an embodiment, each of the first plate PLT2-1 and the second plate PLT2-2 may include two to five sub-plates SPL1 to SPLn. However, the number of sub-plates SPL1 to SPLn constituting each of the first plate PLT2-1 and the second plate PLT2-2 is not limited thereto and may be designed differently according to thickness, strength, and the like of the second support plate PLT2 disposed in the electronic apparatus ED (see FIG. 6A). Each of the first plate PLT2-1 and the second plate PLT2-2 may be provided as a single plate, which corresponds to a case in which there is one sub-plate.

The number of plurality of sub-plates SPL1 to SPLn provided in the first plate PLT2-1 and the second plate PLT2-2 may be adjusted to easily adjust the thickness of each of the first plate PLT2-1 and the second plate PLT2-2. Thus, the second support plate PLT2 having the rigidity and thickness for the electronic apparatus ED may be easily manufactured.

Each of the sub-plates SPL1 to SPLn may include a matrix part MX1 to MXn and reinforcing fiber layers FB1 to FBn. The reinforcing fiber layers FB1 to FBn may be dispersed in the matrix parts MX1 to MXn. The reinforcing fiber layers FB1 to FBn may include at least one of carbon fibers and glass fibers.

The reinforcing fiber layers FB1 to FBn may include a plurality of reinforcing fibers which extend in one direction, and which are arranged in a direction crossing the extending direction. The reinforcing fiber layers FB1 to FBn may include a plurality of reinforcing fibers arranged to cross each other, and the arrangement of the reinforcing fibers will be described in more detail with reference to FIGS. 9A and 9B. A collection of FIGS. 9A and 9B are enlarged perspective views of one sub-plate SPL1 as example, and FIGS. 9A and 9B illustrate substantially the same constituents except for some differences in the arrangement form of the reinforcing fibers FB1-1 and FB1-2.

Referring to FIG. 9A, the reinforcing fiber layer FB1 may include first reinforcing fibers FB1-1 and second reinforcing fibers FB1-2, which have different extension directions. The first reinforcing fibers FB1-1 may extend along the second direction DR2 and may be arranged along the first direction DR1. The second reinforcing fibers FB1-2 may extend along the first direction DR1 and may be arranged along the second direction DR2. The first reinforcing fibers FB1-1 and the second reinforcing fibers FB1-2 may cross each other on the plane, to together define the reinforcing fiber layer FB1. The first reinforcing fibers FB1-1 may be disposed on the second reinforcing fibers FB1-2 as illustrated in FIG. 9A, but is not limited thereto. In an embodiment, for example, the first reinforcing fibers FB1-1 may be disposed below the second reinforcing fibers FB1-2. That is, within the plate (e.g., a sub-plate) of the digitizer, each of the second reinforcing fibers FB1-2 is one of above or below the first reinforcing fibers FB1-1.

The arrangement of the first reinforcing fibers FB1-1 and the second reinforcing fibers FB1-2 is not limited thereto and may be woven with each other as illustrated in FIG. 9B. That is, based on one first reinforcing fiber FB1-1, the first reinforcing fiber FB1-1 may be alternately disposed above and below the second reinforcing fibers FB1-2 in the second direction DR2.

The first and second reinforcing fibers FB1-1 and FB1-2 crossing each other may be disposed to be dispersed in the matrix part MX1. The matrix part MX1 may include a polymer resin. In an embodiment, for example, the matrix part MX1 may include a polyepoxy-based resin, a polyester-based resin, a polyamide-based resin, a polycarbonate-based resin, a polypropylene-based resin, a polybutylene-based resin, or a polyvinyl ester-based resin. However, the material of the matrix part MX1 is not limited to the above example. The matrix part MX1 may be filled in a space between the first and second reinforcing fibers FB1-1 and FB1-2 and may allow the first and second reinforcing fibers FB1-1 and FB1-2 to be in close contact with each other.

The sub-plate SPL1 may further include a dye and a pigment dispersed in the matrix part MX1. In an embodiment, for example, the sub-plate SPL1 may include a black pigment or a black dye dispersed in the matrix part MX1. Thus, each of the first and second plates PLT2-1 and PLT2-2 may have a black color, and the constituents of the electronic apparatus ED (see FIGS. 6A and 6B) disposed under the first and second plates PLT2-1 and PLT2-2 may be prevented from being visually recognized to the outside.

The sub-plate SPL1 may further include inorganic particles dispersed in the matrix part MX1. In an embodiment, for example, inorganic particles include silica, barium sulphate, barium titanate, titanium oxide, sintered talc, zinc borate, zinc titanate, clay, alumina, mica, or boehmite. The inorganic particles dispersed in the matrix part MX1 may supplement strength of the first and second plates PLT2-1 and PLT2-2.

Referring to FIG. 9C, the reinforcing fiber FB within each of the first reinforcing fibers FB1-1 and the second reinforcing fibers FB1-1 may be provided as a plurality of sub-fiber strands S-FB. In an embodiment, for example, the plurality of sub-fiber strands S-FB may be bonded as one bundle to constitute one reinforcing fiber FB.

Figure 10:
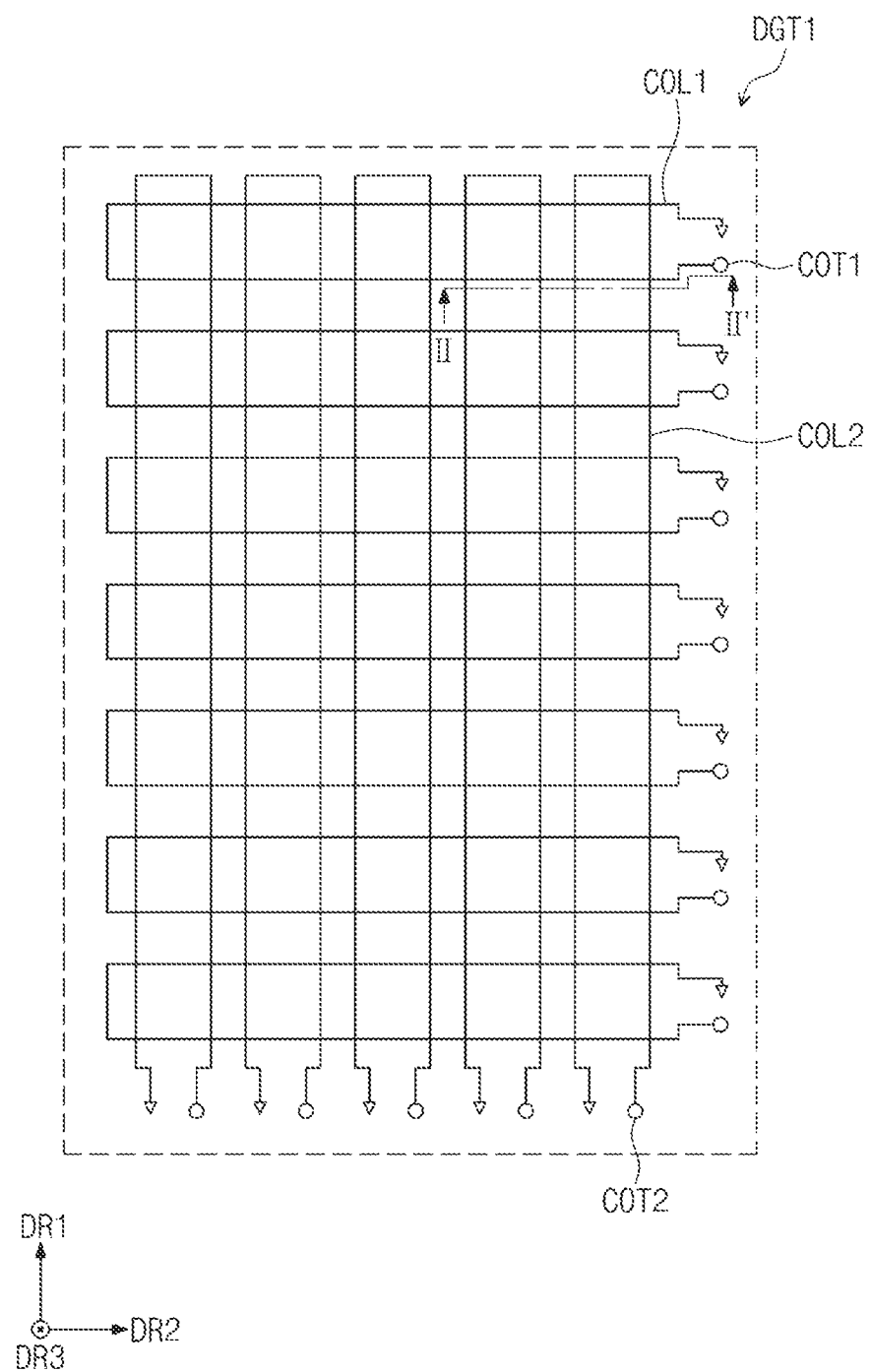
FIG. 10 is a plan view of a sensing part according to an embodiment.
Figure 11:
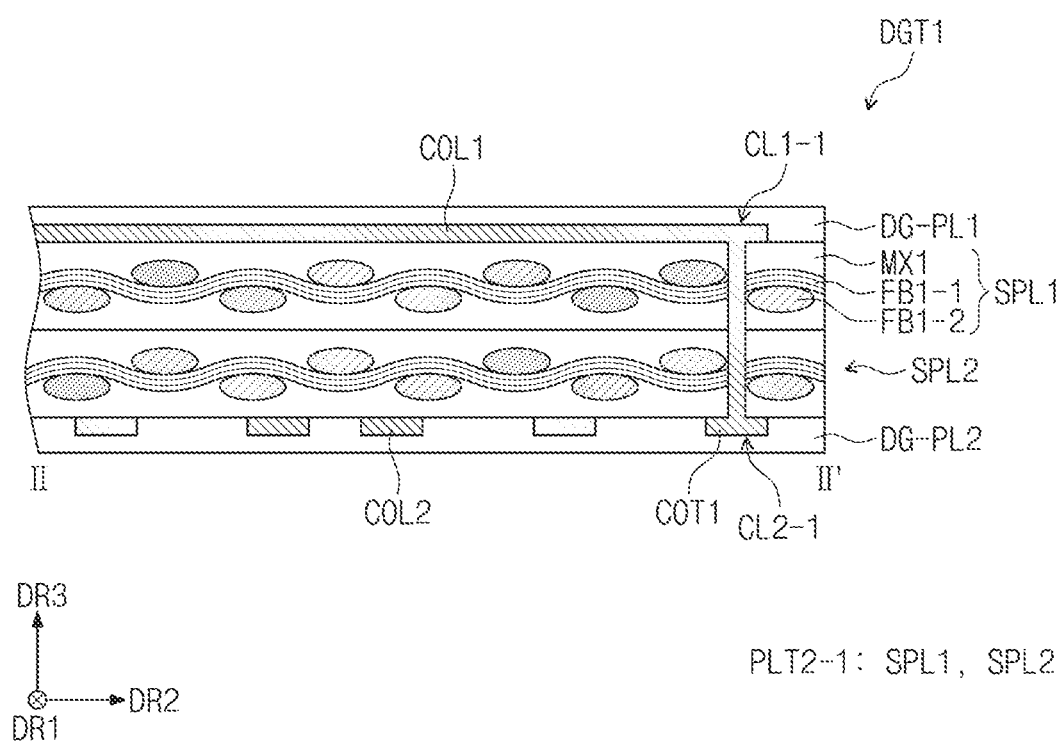
FIG. 11 is a cross-sectional view taken along line II-IF of FIG. 10 in the sensing part according to an embodiment.

FIG. 10 is a plan view of a sensing part according to an embodiment. FIG. 11 is a cross-sectional view taken along line II-IF of FIG. 10 in the sensing part according to an embodiment. Although FIG. 10 illustrates the first sensing part DGT1 as a reference, the second sensing part DGT2 may also include substantially the same constituents. FIG. 10 schematically illustrates shapes of the coils provided in the first sensing part DGT1 on the plane. Hereinafter, the description of the first sensing part DGT1 may be equally applied to the second sensing part DGT2.

Referring to FIG. 10, the first sensing part DGT1 may include first coils COL1, second coils COL2, first terminals COT1, and second terminals COT2. The first coils COL1 may be referred to as driving coils, and the second coils COL2 may be referred to as sensing coils, but is not limited thereto, and vice versa.

Each of the first coils COL1 may be arranged to be spaced apart from each other in the first direction DR1 and may extend along the second direction DR2. Each of the second coils COL2 may be arranged to be spaced apart from each other in the second direction DR2 and may extend along the first direction DR1. Unlike the configuration illustrated in FIG. 10, the first coils COL1 which are adjacent to each other may be arranged to overlap each other, and in this case, a bridge pattern may be disposed on a crossing area of the first coils COL1. Similarly, not limited to that illustrated in FIG. 10, the second coils COL2 which are adjacent to each other may be arranged to overlap each other.

The first terminals COT1 may be connected to ends of the first coils COL1, respectively, and an AC (electrical) signal may be sequentially provided through the first terminals COT1. Other terminals different from the first terminals COT1 of the first coils COL1 may be grounded. Signal lines may be connected to the first terminals COT1 of the first coils COL1, respectively.

When an electrical current flows through the first coils COL1, a magnetic force line may be induced between the first coils COL1 and the second coils COL2. The second coils COL2 may detect the induced electromagnetic force emitted from the electromagnetic pen to output a sensing signal to the second terminals COT2 connected to the second coils COL2. Other terminals different from the second terminals COT2 of the second coils COL2 may be grounded. Signal lines may be connected to the second terminals COT2 of the second coils COL2, respectively.

Referring to FIG. 11, the first sensing part DGT1 may include a first plate PLT2-1 provided as the sensor substrate, a first conductive layer CL1-1, and a second conductive layer CL2-1. The description of the constituents of the first sensing part DGT1 illustrated in FIG. 11 may be the same as the above description.

The first plate PLT2-1 of the first sensing part DGT1 may include a reinforcing fiber composite material. Specifically, the first plate PLT2-1 may include at least one sub-plate including reinforcing fibers. FIG. 11 illustrates an example of the first plate PLT2-1 including two sub-plates SPL1 and SPL2. However, the number of sub-plates provided in the plate constituting the sensing part is not limited thereto and thus may be less or more.

The first sub-plate SPL1 provided in the first plate PLT2-1 may include a matrix part MX1, and first and second reinforcing fibers FB1-1 and FB1-2 woven with each other. The second sub-plate SPL2 may also include substantially the same constituents as the first sub-plate SPL1.

The first conductive layer CL1-1 may be disposed on one surface of the first plate PLT2-1. In an embodiment, for example, the first conductive layer CL1-1 may be in contact with a top surface of the first plate PLT2-1 (e.g., a first surface closest to the display panel DP). The first conductive layer CL1-1 may include first coils COL1 extending in the second direction DR2.

The second conductive layer CL2-1 may be disposed on the other surface (e.g., a second surface opposite to the first surface) of the first plate PLT2-1. In an embodiment, for example, the second conductive layer CL2-1 may be in contact with a bottom surface of the first plate PLT2-1. The second conductive layer CL2-1 may include second coils COL2 extending along the first direction DR1.

The second conductive layer CL2-1 may include the first terminals COT1 and the second terminals COT2 of FIG. 10. The first terminals COT1 disposed on a surface of the first plate PLT2-1, which is different from the first coils COL1, may be connected to the first coils COL1 through a contact hole passing through the first plate PLT2-1. Since the first plate PLT2-1 includes the reinforcing fiber composite material, a process of forming a hole in the respective plate may be facilitated.

The first sensing part DGT1 may further include plate insulating layers DG-PL1 and DG-PL2, which are disposed on one surface and the other surface of the first plate PLT2-1, respectively, to cover the first coils COL1 and the second coils COL2. The plate insulating layers DG-PL1 and DG-PL2 may include a polymer material and may protect the first coils COL1 and the second coils COL2.

Figure 12:
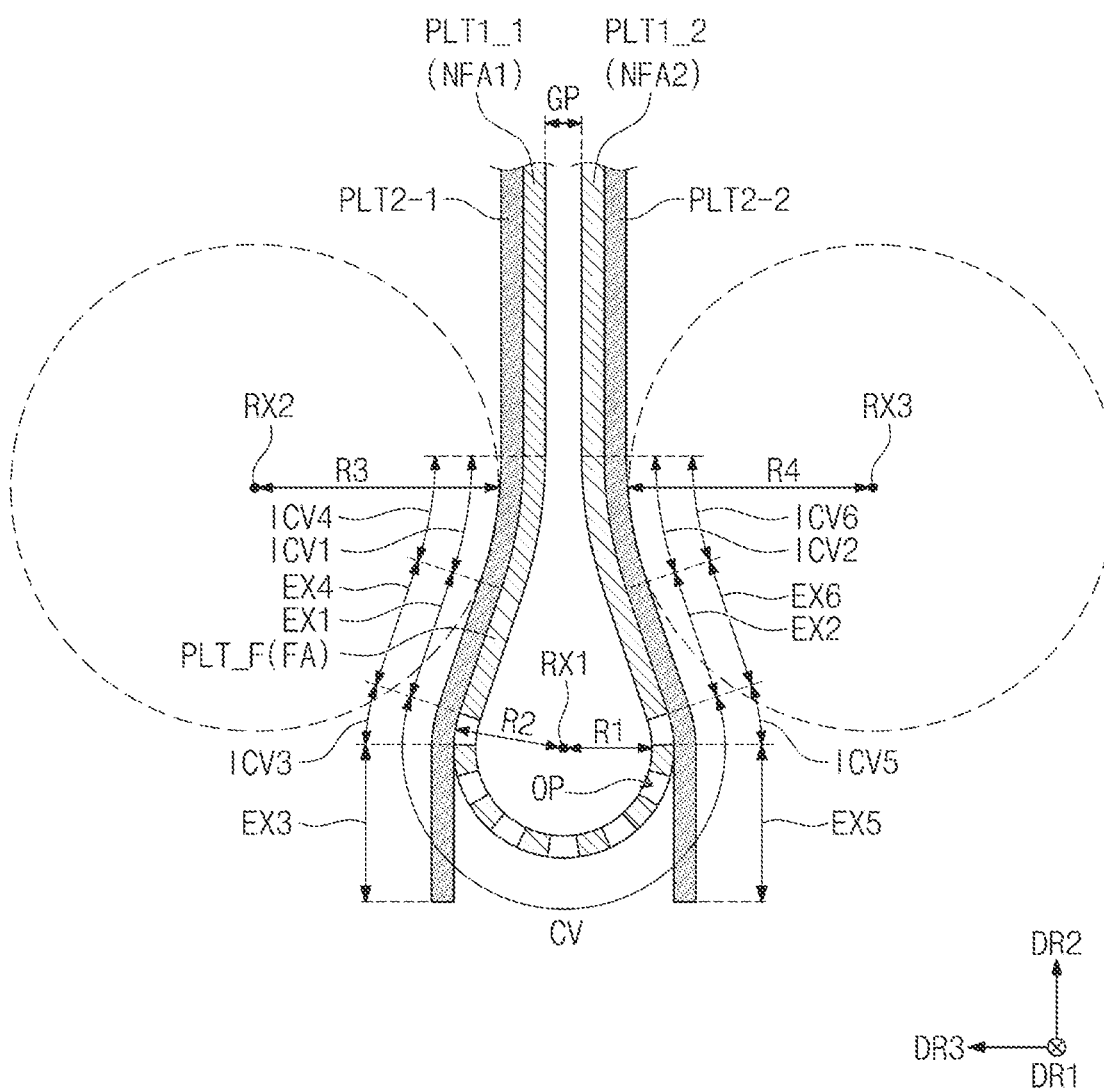
FIG. 12 is a cross-sectional view of support plates, which are in a folded state, according to an embodiment.

FIG. 12 is a cross-sectional view of the support plates, which are in a folded state, according to an embodiment. FIG. 12 schematically illustrates cross-sections of the first support plate PLT1 and the second support plate PLT2 among the constituents of the above-described electronic apparatus ED for convenience of explanation, and the remaining constituents will be omitted.

Referring to FIG. 12, the cross-sections of the first and second support plates PLT1 and PLT2 that are in the folded state when viewed in the first direction DR1, and the first and second supporting portions PLT1_1 and PLT1_2 of the first support plate PLT1, are illustrated to face an upper side.

A folding portion PLT_F of the first support plate PLT1 may include a first curvature part ICV1, a first extension part EX1, a folding part CV, a second extension part EX2, and a second curvature part ICV2, which are integrated with each other. The folding portion PLT_F, together with a remainder of the first support plate PLT1, may form the dumbbell shape.

The folding part CV may be disposed between the first extension part EX1 and the second extension part EX2, and connect the first extension part EX1 and the second extension part EX2 to each other. The first extension part EX1 may extend from one end (e.g., a first end) of the folding part CV parallel to the first direction DR1, and the second extension part EX2 may extend from the other end (e.g., a second end opposite to the first end) of the folding part CV parallel to the first direction DR1. The first extension part EX1 may be disposed between the first curvature part ICV1 and the folding part CV. The second extension part EX2 may be disposed between the second curvature part ICV2 and the folding part CV.

A plurality of openings OP may be defined in the folding part CV of the first support plate PLT1. The plurality of openings OP may be arranged in the first direction DR1 and the second direction DR2 as described above with reference to FIG. 7B. The plurality of openings OP may have a shape lengthily extending in the first direction DR1 parallel to a respective folding axis (e.g., a major dimension, such as a length, extending in the first direction DR1). The folding part CV may be easily folded by the plurality of openings OP defined in the folding part CV.

When the first support plate PLT1 is folded, the folding part CV may be bent to have a first curvature radius R1 with respect to a first curvature center RX1 facing a top surface of the first support plate PLT1. Each of the first curvature part ICV1 and the second curvature part ICV2 may be bent to be opposite to the folding portion CV. That is, each of the first and second curvature parts ICV1 and ICV2 may be bent while having a respective curvature radius with respect to a respective curvature center facing a bottom surface of the first support plate PLT1. An inflection point may be respectively between the folding part CV, and each of the first extension part EX1 and the second extension part EX2. The first curvature part ICV1 and the second curvature part ICV2 may have a symmetrical shape.

When the first support plate PLT1 is folded, the first supporting portion PLT1_1 and the second supporting portion PLT1_2 (e.g., the remainder of the first support plate PLT1) may be maintained in the flat state. When the first support plate PLT1 is folded, a spaced distance GP between the first supporting portion PLT1_1 and the second supporting portion PLT1_2 in the third direction DR3 may be less than the first curvature radius R1. Thus, the first support plate PLT1 may be folded into a dumbbell shape. The dumbbell shape may have a minimum gap between portions of the first support plate PLT1, at the spaced distance GP (e.g., at the first supporting portion PLT1_1 and the second supporting portion PLT1_2 which are spaced apart from each other).

The second support plate PLT2 disposed under the first support plate PLT1 and further from the display panel DP than the first support plate PLT1, may include a curvature part corresponding to the folded shape of the first support plate PLT1 that is folded into the dumbbell shape. Each of the first plate PLT2-1 and the second plate PLT2-2 constituting the second support plate PLT2 may include curvature parts ICV3, ICV4, ICV5, and ICV6.

Specifically, the first plate PLT2-1 may include a third extension part EX3, a third curvature part ICV3, a fourth extension part EX4, and a fourth curvature part ICV4, which are integrated with each other, to correspond to the folding area FA. The second plate PLT2-2 may include a fifth extension part EX5, a fifth curvature part ICV5, a sixth extension part EX6, and a sixth curvature part ICV6, which are integrated with each other, to correspond to the folding area FA. Hereinafter, the first plate PLT2-1 will be mainly described, and the description of the first plate PLT2-1 may also be applied to the second plate PLT2-2.

In an electronic apparatus ED which is flat, the third extension part EX3 of the first plate PLT2-1 may include an end of the first plate PLT2-1 adjacent to (e.g., closest to) the second plate PLT2-2, at the folding area FA. When the second support plate PLT2 is folded together with other elements of the electronic apparatus ED, the third extension part EX3 of the first plate PLT2-1 may be spaced apart from the fifth extension part EX5 of the second plate PLT2-2 in the third direction DR3 to face the fifth extension part EX5. As the third extension part EX3 of the first plate PLT2-1 and the fifth extension part EX5 of the second plate PLT2-2 are spaced apart from each other, the second support plate PLT2 may not be folded at a respective curvature at an area corresponding to a center of the folding part CV, and thus, the second support plate PLT2 may be easily folded.

The third extension part EX3 of the first plate PLT2-1 may overlap the folding area FA. That is, in the unfolded state, the third extension part EX3 of the first plate PLT2-1 may overlap the folding portion PLT_F of the first support plate PLT1 on the plane. The third curvature part ICV3 of the first plate PLT2-1 may be disposed between the third extension part EX3 and the fourth extension part EX4. The fourth curvature part ICV4 of the first plate PLT2-1 may be disposed between the fourth extension part EX4 and a remaining portion of the first plate PLT2-1 corresponding to the non-folding area NFA1. A boundary of the fourth curvature part ICV4 with the remaining portion of the first plate PLT2-1, may substantially correspond to a boundary between the first non-folding area NFA1 and the folding area FA.

When the second support plate PLT2 is folded, the third curvature part ICV3 may be bent to have a second curvature radius R2 with respect to the first curvature center RX1 facing a top surface of the first plate PLT2-1. The fourth curvature part ICV4 of the first plate PLT2-1 may be bent to be opposite to the third curvature part ICV3. The fourth curvature part ICV4 may be bent to have a third curvature radius R3 with respect to a second curvature center RX2 facing the bottom surface of the first plate PLT2-1. Likewise, the fifth curvature part ICV5 of the second plate PLT2-2 may be bent to be opposite to the sixth curvature part ICV6. That is, folding of the display panel DP may dispose the second support plate PLT2 to have a curvature part (e.g., third and fourth curvature parts ICV3 and ICV4, or ICV5 and ICV6) at the folding area FA, and the curvature part may have two curvatures in opposite directions.

When the second support plate PLT2 is folded, the first plate PLT2-1 may have a substantially symmetrical shape relative to the second plate PLT2-2. The fifth curvature part ICV5 of the second plate PLT2-2 may be bent to substantially have a second curvature radius R2 with respect to the first curvature center RX1 facing the top surface of the second plate PLT2-2. The sixth curvature portion ICV6 may be bent to have a fourth curvature radius R4 with respect to a third curvature center RX3 facing the bottom surface of the second plate PLT2-2. The fourth curvature radius R4 may be substantially equal to the third curvature radius R3.

In an embodiment, the second curvature radius R2 may be less than the third curvature radius R3. Since the curvature radius is inversely proportional to the curvature, the curvature of the third curvature part ICV3 may be greater than that of the fourth curvature part ICV4.

Each of the first plate PLT2-1 and the second plate PLT2-2 include the reinforcing fiber composite material. Thus, flexibility of the first reinforcing fiber composite plate and the second reinforcing fiber composite plate may be improved and be easily bendable to have the curvature parts ICV3, ICV4, ICV5, ICV6 that are curved opposite to each other. In an embodiment, the display panel DP which is folded disposes the plate of the digitizer (e.g., the second support plate PLT2) including a first curvature portion (e.g., ICV3 or ICV5) overlapping the folding area FA of the display panel DP, the first curvature portion having a first curvature with respect to a first curvature center RX1 defined facing the top surface of the plate, and a second curvature portion (e.g., ICV4 or ICV6) extending from the first curvature portion and in a direction towards the non-folding area, the second curvature portion having a second curvature with respect to a second curvature center RX2 (or third curvature center RX3) defined facing the bottom surface of the plate.

The first plate PLT2-1 and the second plate PLT2-2 including the curvature parts ICV3, ICV4, ICV5, and ICV6 may be provided as the sensor substrate of the digitizer DGT (see FIG. 6B) as described above. Since the digitizer DGT (see FIG. 6B) may include the first plate PLT2-1 and the second plate PLT2-2, the sensing parts DGT1 and DGT2 (see FIG. 6B) of the digitizer DGT (see FIG. 6B) may be easily bent into a shape corresponding to the first support plate PLT1 that is folded into the dumbbell shape. As a result, it is possible to provide the reliable digitizer DGT (see FIG. 6B) to the dumbbell-type foldable electronic apparatus without disposing the plurality of additional sub-digitizers corresponding to the folding area FA, and the constituents of the electronic apparatus ED may be simplified.

The electronic apparatus ED according to the embodiment may include the support plate including the reinforcing fiber to improve the flexibility and rigidity of the electronic apparatus ED.

The electronic apparatus ED according to the embodiment may include the display panel DP, which is simplified in laminated structure, and the digitizer to maintain the folding reliability of the electronic apparatus ED and reduce the thickness of the electronic apparatus ED to realize the lightweight electronic apparatus.

It will be apparent to those skilled in the art that various modifications and deviations can be made in the invention. Thus, it is intended that the invention covers the modifications and deviations of the embodiments, provided they come within the scope of the appended claims and their equivalents.

Accordingly, the technical scope of the invention should not be limited to the contents described in the detailed description of the specification, but should be determined by the claims.

What is claimed is:

1. An electronic apparatus comprising:
   a display element layer comprising a folding area foldable with respect to a folding axis, and a non-folding area which is adjacent to the folding area;
   a plurality of support plates under the display element layer and facing the folding area and the non-folding area thereof;
   the plurality of support plates comprising a first support plate and a second support plate which is further from the display element layer than the first support plate;
   a plurality of conductive layers facing each other; and
   a reinforcing fiber plate defining the second support plate further from the display element layer than the first support plate,
   wherein
   the second support plate further from the display element layer than the first support plate is disposed between the plurality of conductive layers, the second support plate together with the plurality of conductive layers defining a digitizer which detects a first external input, and
   the display element layer which is folded disposes the second support plate of the digitizer comprising at the folding area:
   a first curvature part having a first curvature with respect to a first curvature center defined facing a first surface of the second support plate, and
   a second curvature part extending from the first curvature part and in a direction towards the non-folding area, the second curvature part having a second curvature with respect to a second curvature center defined facing a second surface of the second support plate which is opposite to the first surface.

2. The electronic apparatus of claim 1, wherein the reinforcing fiber plate of the second support plate further from the display element layer than the first support plate further comprises:
   a matrix part comprising a polymer, and
   a reinforcing fiber in the matrix part.

3. The electronic apparatus of claim 2, wherein the reinforcing fiber plate of the second support plate further from the display element layer than the first support plate further comprises an inorganic material in the matrix part.

4. The electronic apparatus of claim 2, wherein the reinforcing fiber plate of the second support plate further from the display element layer than the first support plate further comprises a black pigment or a black dye in the matrix part.

5. The electronic apparatus of claim 1, wherein the reinforcing fiber plate of the second support plate further from the display element layer than the first support plate has a thickness of about 30 micrometers or more to about 150 micrometers or less.

6. The electronic apparatus of claim 1, wherein the reinforcing fiber plate of the second support plate further from the display element layer than the first support plate has a flexural modulus of about 10 gigapascals or more to about 50 gigapascals or less.

7. The electronic apparatus of claim 1, wherein the reinforcing fiber plate of the second support plate further from the display element layer than the first support plate further comprises the reinforcing fiber provided in plural including:
first reinforcing fibers extending in a first direction,
second reinforcing fibers extending in a second direction crossing the first direction, and
the first reinforcing fibers and the second reinforcing fibers crossing each other.

8. The electronic apparatus of claim 7, wherein
the folding axis extends in an extension direction, and
the first direction in which the first reinforcing fibers extend is parallel to the extension direction of the folding axis.

9. The electronic apparatus of claim 7, wherein within the reinforcing fiber plate of the second support plate further from the display element layer than the first support plate, each of the second reinforcing fibers is one of above or below the first reinforcing fibers.

10. The electronic apparatus of claim 7, wherein within the reinforcing fiber plate of the second support plate further from the display element layer than the first support plate, each of the second reinforcing fibers is alternately above and below the first reinforcing fibers.

11. The electronic apparatus of claim 7, wherein within the second support plate,
the reinforcing fiber plate is provided in plural each comprising the first reinforcing fibers and the second reinforcing fibers, and
the plurality of conductive layers comprises a first conductive layer facing a second conductive layer with the plurality of reinforcing fiber plates therebetween.

12. The electronic apparatus of claim 1, further comprising an input sensor which faces the digitizer and detects a second external input different from the first external input.

13. An electronic apparatus comprising:
a display panel comprising a folding area foldable with respect to a folding axis, and a non-folding area which is adjacent to the folding area;
a support plate facing the display panel; and
a digitizer which faces the folding area with the support plate therebetween, faces the non-folding area the display panel with the support plate therebetween, and detects a first external input, the digitizer being foldable together with the display panel and comprising:
a plate comprising a reinforcing fiber, a first surface closest to the support plate, and a second surface opposite to the first surface;
a first conductive layer on the first surface of the plate; and
a second conductive layer on the second surface of the plate,
wherein the display panel which is folded disposes the plate of the digitizer comprising at the folding area:
a first curvature part having a first curvature with respect to a first curvature center defined facing the first surface of the plate; and
a second curvature part extending from the first curvature part and in a direction towards the non-folding area, the second curvature part having a second curvature with respect to a second curvature center defined facing the second surface of the plate.

14. The electronic apparatus of claim 13, wherein within the plate of the digitizer which is folded, the first curvature is greater than the second curvature.

15. The electronic apparatus of claim 13, wherein the support plate defines a plurality of openings corresponding to the folding area.

16. The electronic apparatus of claim 15, wherein the plurality of openings of the support plate are arranged in a lattice shape.

17. An electronic apparatus comprising:
a display panel comprising:
a folding area foldable with respect to a folding axis, and a non-folding area which is adjacent to the folding area;
a base substrate; and
a display element layer including a light emitting element;
a plurality of support plates comprising:
a first support plate disposed below the base substrate, and
a second support plate disposed below the first support plate and further from the display element layer than the first support plate;
a reinforcing fiber plate defining each of the first support plate and the second support plate which are further from the display element layer than the base substrate,
wherein
the reinforcing fiber plate defining the first support plate defines a plurality of openings in the first support plate,
the reinforcing fiber plate defining the second support plate comprises a reinforcing fiber being disconnected at the folding area, and
the display panel which is folded disposes the second support plate comprising at the folding area:
a first curvature part having a first curvature with respect to a first curvature center defined facing a first surface of the second support plate, and
a second curvature part extending from the first curvature part and in a direction towards the non-folding area, the second curvature part having a second curvature with respect to a second curvature center defined facing a second surface of the second support plate which is opposite to the first surface.

18. The electronic apparatus of claim 17, wherein
the second support plate is further from the display element layer than both the base substrate and the first support plate and defines a plate of a digitizer within the electronic apparatus which detects an external input, and
the digitizer includes a plurality of conductive layers on the plate which is defined by the second support plate comprising the reinforcing fiber.

19. The electronic apparatus of claim 17, wherein
the second support plate is further from the display element layer than both the base substrate and the first support plate, and
the reinforcing fiber is provided in plural including:
first reinforcing fibers extending in a first direction; and
second reinforcing fibers extending in a second direction crossing the first direction.

20. The electronic apparatus of claim 17, wherein
the second support plate is further from the display element layer than both the base substrate and the first support plate, corresponds to the folding area and the non-folding area of the display panel and is foldable together with the display panel, the display panel which is folded disposes the second support plate having a curvature part at the folding area, and the curvature part includes two curvatures in opposite directions from each other.

* * * * *